(12) United States Patent
Lee et al.

(10) Patent No.: US 11,599,301 B2
(45) Date of Patent: Mar. 7, 2023

(54) SEMICONDUCTOR MEMORY DEVICE AND SYSTEM INCLUDING THE SAME

(71) Applicant: SAMSUNG ELECTRONICS CO., LTD., Suwon-si (KR)

(72) Inventors: Haesuk Lee, Seongnam-si (KR); Reum Oh, Hwaseong-si (KR); Youngcheon Kwon, Hwaseong-si (KR); Beomyong Kil, Seoul (KR); Jemin Ryu, Suwon-si (KR); Jihyun Choi, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 124 days.

(21) Appl. No.: 17/245,325

(22) Filed: Apr. 30, 2021

(65) Prior Publication Data

US 2022/0083260 A1    Mar. 17, 2022

(30) Foreign Application Priority Data

Sep. 17, 2020  (KR) .......................... 10-2020-0119732

(51) Int. Cl.
*G06F 3/06* (2006.01)
*G11C 7/22* (2006.01)

(52) U.S. Cl.
CPC .......... *G06F 3/0655* (2013.01); *G06F 3/0604* (2013.01); *G06F 3/0679* (2013.01); *G11C 7/222* (2013.01); *G11C 7/225* (2013.01)

(58) Field of Classification Search
CPC .... G06F 3/0655; G06F 3/0604; G06F 3/0679; G06F 3/0658; G06F 3/0659; G11C 7/222;
(Continued)

(56) References Cited

U.S. PATENT DOCUMENTS 9,153,299 B2   10/2015   Stephens, Jr.
9,170,948 B2   10/2015   Loh et al.
(Continued)

OTHER PUBLICATIONS

Extended European Search Report dated Dec. 7, 2021 from the European Patent Office for corresponding European Patent Application No. 21184321.4.

*Primary Examiner* — Huan Hoang
*Assistant Examiner* — Minh Dinh
(74) *Attorney, Agent, or Firm* — Lee IP Law, P.C.

(57) ABSTRACT

A semiconductor memory device includes an interface semiconductor die, at least one memory semiconductor die, and through-silicon vias connecting the interface semiconductor die and the memory semiconductor die. The interface semiconductor die includes command pins to receive command signals transferred from a memory controller and an interface command decoder to decode the command signals. The memory semiconductor die includes a memory integrated circuit configured to store data and a memory command decoder to decode the command signals transferred from the interface semiconductor die. The interface semiconductor die does not include a clock enable pin to receive a clock enable signal from the memory controller. The interface and memory command decoders generate interface and memory clock enable signals to control clock supply with respect to the interface and memory semiconductor dies based on a power mode command transferred through the plurality of command pins from the memory controller.

20 Claims, 23 Drawing Sheets

(58) Field of Classification Search
CPC ... G11C 7/225; G11C 2207/2227; G11C 7/22; G11C 5/063; G11C 8/10; H01L 23/481; H01L 25/0657
USPC ...................................................... 365/233.1
See application file for complete search history.

(56) References Cited

U.S. PATENT DOCUMENTS

| | | |
|---|---|---|
| 9,202,551 B2 | 12/2015 | Bains et al. |
| 9,620,194 B1 | 4/2017 | Lee et al. |
| 9,652,170 B2 | 5/2017 | Vogt |
| 10,163,486 B1 | 12/2018 | Gajapathy |
| 10,630,294 B1 * | 4/2020 | Choi ................... H03B 5/1271 |
| 2012/0195148 A1 | 8/2012 | Yoko |
| 2016/0350002 A1 | 12/2016 | Vergis et al. |
| 2018/0121124 A1 * | 5/2018 | Choi ..................... G06F 3/0604 |
| 2021/0064467 A1 * | 3/2021 | Buerkle .............. G06F 11/1048 |
| 2021/0202328 A1 * | 7/2021 | Kariya ................... G11C 29/38 |

* cited by examiner

FIG. 10

ROW COMMAND

| CMD | CK | R0 | R1 | R2 | R3 | R4 | R5 | R6 | R7 | R8 | R9 |
|---|---|---|---|---|---|---|---|---|---|---|---|
| RNOP | R or F | H | H | H | H | V | V | V | V | V | V |
| ACT | R | L | H | H | H | SID0/V | SID1/V | BA0 | BA1 | BA2 | BA3 |
| ACT | F | H | H | H | PC | RA10 | RA11 | RA12 | RA13/V | RA14/V | RA15/V |
| ACT | R | H | H | RA8 | RA9 | RA2 | RA3 | RA4 | RA5 | RA6 | RA7 |
| PDE | R | L | H | RA0 | RA1 | V | V | V | V | V | V |
| PDE | F | L | H | L | H | V | V | V | V | V | V |
| SRE | R | L | H | L | L | V | V | V | V | V | V |
| SRE | F | L | H | L | L | V | V | V | V | V | V |
| PDX/SRX | R | H | H | H | H | V | V | V | V | V | V |

FIG. 11

COLUMN COMMAND

| CMD | CK | C0 | C1 | C2 | C3 | C4 | C5 | C6 | C7 |
|---|---|---|---|---|---|---|---|---|---|
| CNOP | R | H | H | H | V | V | V | V | V |
|  | F | V | V | V | V | V | V | V | V |
| RD | R | H | L | H | L | PC | SID0/V | SID1/V | BA0 |
|  | F | BA1 | BA2 | BA3 | CA0 | CA1 | CA2 | CA3 | CA4 |
| WR | R | H | L | L | L | PC | SID0/V | SID1/V | BA0 |
|  | F | BA1 | BA2 | BA3 | CA0 | CA1 | CA2 | CA3 | CA4 |
| MRS | R | L | L | L | MA4 | OP5 | OP6 | OP7 | MA0 |
|  | F | MA1 | MA2 | MA3 | OP0 | OP1 | OP2 | OP3 | OP4 |

SEMICONDUCTOR MEMORY DEVICE AND SYSTEM INCLUDING THE SAME

CROSS-REFERENCE TO RELATED APPLICATION

Korean Patent Application No. 10-2020-0119732, filed on Sep. 17, 2020, in the Korean Intellectual Property Office, and entitled: "Semiconductor Memory Device and System Including the Same," is incorporated by reference herein in its entirety.

BACKGROUND

1. Field

Embodiments relate to semiconductor integrated circuits, and more particularly to a semiconductor memory device and a system including a semiconductor memory device.

2. Description of the Related Art

Circuits may be integrated in a limited area for high capacity, miniaturization, high operation speed, etc. Memory capacity and speed of a semiconductor memory device may be increased according to increasing speed of hardware and increasing complexity of software. A plurality of semiconductor dies may be stacked in a package of a memory chip to increase the memory capacity for a same area.

SUMMARY

Embodiments are directed to a semiconductor memory device, including: an interface semiconductor die including a plurality of command pins configured to receive a plurality of command signals, which are transferred from a memory controller, and including an interface command decoder configured to decode the plurality of command signals; a memory semiconductor die stacked with the interface semiconductor die, the memory semiconductor die including a memory integrated circuit configured to store data, and including a memory command decoder configured to decode the plurality of command signals, which are transferred from the interface semiconductor die; and a plurality of through-silicon vias electrically connecting the interface semiconductor die and the memory semiconductor die. The interface semiconductor die may not include a clock enable pin to receive a clock enable signal from the memory controller. The interface command decoder may be configured to generate an interface clock enable signal to control a first clock supply with respect to the interface semiconductor die based on a power mode command, which is transferred through the plurality of command pins from the memory controller. The memory command decoder may be configured to generate a memory clock enable signal to control a second clock supply with respect to the memory semiconductor die based on the power mode command, which is transferred through the plurality of through-silicon vias from the interface semiconductor die.

Embodiments are also directed to a system, including: a semiconductor memory device; and a host device including a memory controller configured to control the semiconductor memory device. The semiconductor memory device may include: an interface semiconductor die including a plurality of command pins configured to receive a plurality of command signals, which are transferred from the memory controller, and including an interface command decoder configured to decode the plurality of command signals; a memory semiconductor die stacked with the interface semiconductor die, the memory semiconductor device including a memory integrated circuit configured to store data, and including a memory command decoder configured to decode the plurality of command signals, which are transferred from the interface semiconductor die; and a plurality of through-silicon vias electrically connecting the interface semiconductor die and the memory semiconductor die. The interface semiconductor die may not include a clock enable pin to receive a clock enable signal from the memory controller. The interface command decoder may be configured to generate an interface clock enable signal to control a first clock supply with respect to the interface semiconductor die based on a power mode command, which is transferred through the plurality of command pins from the memory controller. The memory command decoder may be configured to generate a memory clock enable signal to control a second clock supply with respect to the memory semiconductor die based on the power mode command, which is transferred through the plurality of through-silicon vias from the interface semiconductor die.

Embodiments are also directed to a semiconductor memory device, including: an interface semiconductor die including a plurality of command pins configured to receive a plurality of command signals, which are transferred from a memory controller, and including an interface command decoder configured to decode the plurality of command signals; a memory semiconductor die including a memory integrated circuit configured to store data, and including a memory command decoder configured to decode the plurality of command signals, which are transferred from the interface semiconductor die; and a plurality of internal command paths electrically connecting the interface semiconductor die and the memory semiconductor die. The interface semiconductor die may not include a clock enable pin to receive a clock enable signal from the memory controller. The interface command decoder may be configured to generate an interface clock enable signal to control a first clock supply with respect to the interface semiconductor die based on a power mode command, which is transferred through the plurality of command pins from the memory controller. The memory command decoder may be configured to generate a memory clock enable signal to control a second clock supply with respect to the memory semiconductor die based on the power mode command, which is transferred through the plurality of internal command paths from the interface semiconductor die.

BRIEF DESCRIPTION OF THE DRAWINGS

Features will become apparent to those of skill in the art by describing in detail example embodiments with reference to the attached drawings in which:

FIGS. 10 and 11 are diagrams illustrating an example embodiment of commands of an HBM device according to example embodiments.

DETAILED DESCRIPTION

Figure 1:
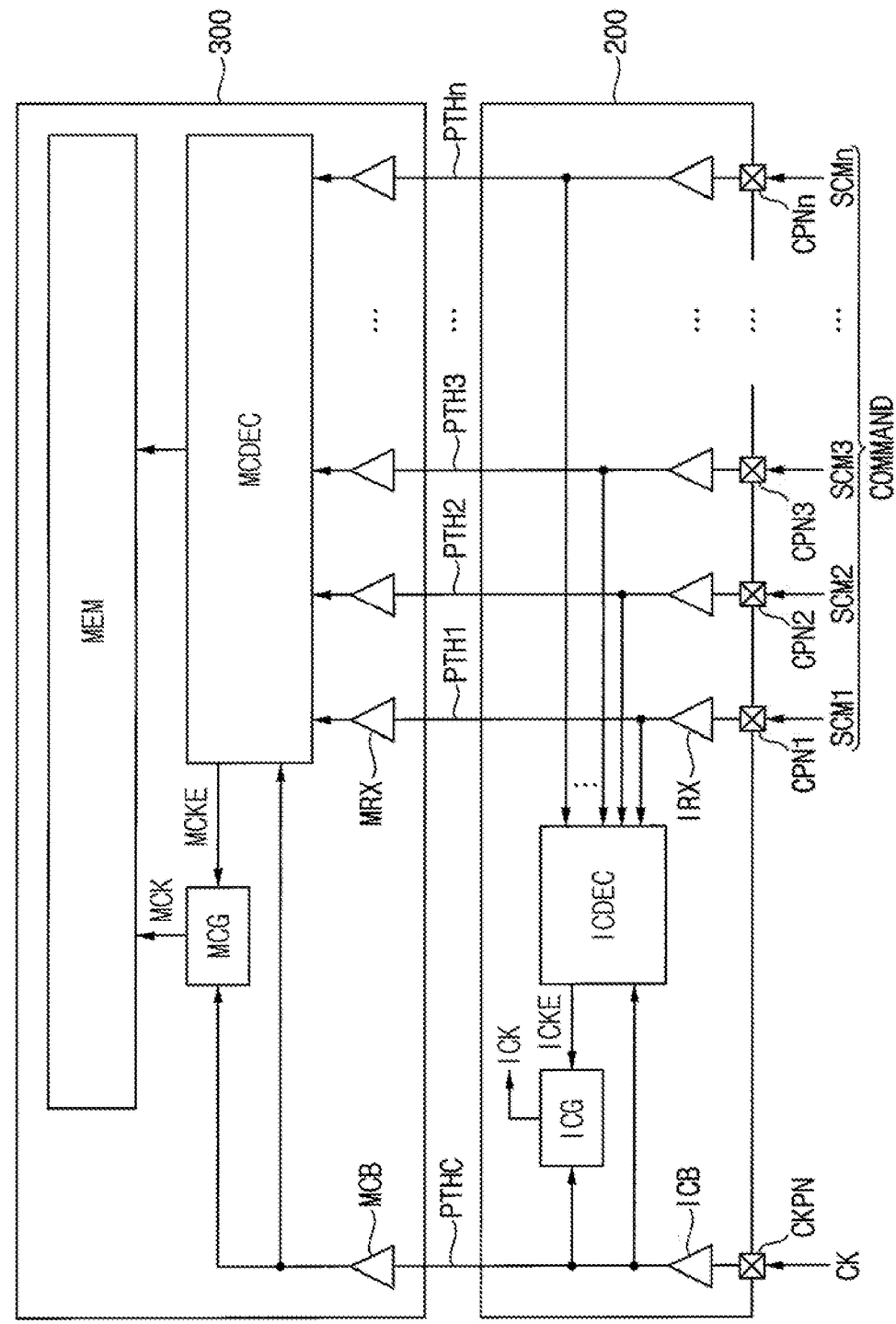
FIG. 1 is a block diagram illustrating a semiconductor memory device according to example embodiments.

FIG. 1 is a block diagram illustrating a semiconductor memory device according to example embodiments.

Referring to FIG. 1, a semiconductor memory device 100 may include an interface semiconductor die 200, one or more memory semiconductor dies 300, and a plurality of internal command paths PTH1~PTHn communicating between the interface semiconductor die and the one or more memory semiconductor dies 300.

The interface semiconductor die 200 may include a plurality of command pins CPN1~CPNn configured to receive a plurality of command signals SCM1~SCMn transferred from a memory controller or a host device. The interface semiconductor die 200 may include and an interface command decoder ICDEC configured to decode the plurality of command signals SCM1~SCMn.

The interface semiconductor die 200 may include an interface clock gating circuit ICG, a clock pin CKPN configured to receive an external clock signal CK transferred from the memory controller, a clock buffer ICB configured to buffer and output the external clock signal CK, and a plurality of command receivers IRX configured to sample and output the plurality of command signals SCM1~SCMn.

Although not illustrated in FIG. 1, the interface semiconductor die 200 may further include data pins configured to exchange data with the memory controller, and control pins configured to receive control signals from the memory controller.

In some example embodiments, the plurality of command signals SCM1~SCMn may include a command to instruct an operation of the semiconductor memory device 100, and an address to access the memory integrated circuit. In this case, the command signal may be referred to as a command-address signal, and the command pin may be referred to as a command-address pin. In some example embodiments, the plurality of command signals SCM1~SCMn may include only the command, whereas the address may be provided through address pins distinct from the command pins.

The interface clock gating circuit ICG may receive the external clock signal CK transferred from the memory controller, and may gate the external clock signal CK based on an interface clock enable signal ICKE to provide an interface clock signal ICK for operations of the interface semiconductor die 200.

The memory semiconductor die 300 may include a memory integrated circuit MEM configured to store data. The memory semiconductor die 300 may include a memory command decoder MCDEC configured to decode the plurality of command signals SCM1~SCMn transferred from the interface semiconductor die 200.

The memory semiconductor die 300 may include a memory clock gating circuit MCG, a clock buffer MCB configured to buffer and output the external clock signal CK transferred from the interface semiconductor die 200. The memory semiconductor die 300 may include a plurality of command receivers MRX configured to sample and output the plurality of command signals SCM1~SCMn.

The memory clock gating circuit MCG may receive the external clock signal CK transferred from the interface semiconductor die 200, and may gate the external clock signal CK based on a memory clock enable signal MCKE to provide a memory clock signal MCK for operations of the memory semiconductor die 300.

In the present example embodiment, as illustrated in FIG. 1, the interface semiconductor die 200 does not include a clock enable pin to receive a clock enable signal from the memory controller. The interface command decoder ICDEC and the memory command decoder MCDEC may control a clock supply with respect to the interface semiconductor die 200 and the memory semiconductor die 300, respectively, based on the plurality of command signals SCM1~SCMn transferred from the memory controller. Thus, the interface command decoder ICDEC may generate the interface clock enable signal ICKE to control the clock supply with respect to the interface semiconductor die 200 based on the plurality of command signals SCM1~SCMn, and the memory command decoder MCDEC may generate the memory clock enable signal MCKE to control the clock supply with respect to the memory semiconductor die 300 based on the plurality of command signals SCM1~SCMn.

As such, the semiconductor memory device 100 according to example embodiments may enhance design margin and reduce the size of the semiconductor memory device 100 by removing the clock enable pin and controlling the clock supply based on the command signals.

The internal command paths PTH1~PTHn may electrically connect the interface semiconductor die 200 and the memory semiconductor die 300, and the plurality of command signals SCM1~SCMn may be transferred through the internal command paths PTH1~PTHn from the interface semiconductor die 200 to the memory semiconductor die 300.

In addition, an internal clock path PTHC may electrically connect the interface semiconductor die 200 and the memory semiconductor die 300. The external clock signal CK may be transferred through the internal clock path PTHC from the interface semiconductor die 200 to the memory semiconductor die 300.

In some example embodiments, the semiconductor memory device 100 may be a stacked memory device in which the memory semiconductor die 300 is stacked with the interface semiconductor die 200. In this case, each of the plurality of internal command paths PTH1~PTHn and the internal clock path PTHC may include a through-substrate via or a through-silicon via (TSV). According to the present example embodiment, the interface semiconductor die 200 does not include the clock enable pin to receive the clock enable signal, and thus the through-silicon vias electrically connecting the interface semiconductor die 200 and the memory semiconductor die 300 do not include a through-silicon via to transfer the clock enable signal.

In general, in a stacked memory device, stacked semiconductor dies exchange a clock signal and signals aligned to the clock signal. If the interface semiconductor die 200 decodes command signals and transfers internal control signals to the memory semiconductor die 300, it is difficult to align the internal control signals to the clock signal. The relative delay amount of the clock signal with respect to the internal clock signals may vary depending on variations of manufacturing process, an operation voltage, a temperature, a performance of the command decoder, a decoding time etc., and probability of errors may be increased.

According to the present example embodiment, the interface semiconductor die 200 transfers the plurality of command signals SCM1~SCMn, which are not decoded, to the memory semiconductor die 300, and, in the memory semiconductor die 300, the memory command decoder MCDEC may decode the plurality of command signals SCM1~SCMn independently of the interface command decoder ICDEC.

The interface semiconductor die 200 may focus on alignment of the command signals SCM1~SCMn to a clock signal, and each of the interface semiconductor die 200 and the memory semiconductor die 300 may decode the command signals SCM1~SCMn using each of the interface command decoder ICDEC and the memory command decoder MCDEC. Accordingly, an additional circuitry for signal alignment may not be provided, and performance of the semiconductor memory device 100 may be enhanced.

As such, the semiconductor memory device 100 according to example embodiments may efficiently implement signal synchronization by transferring undecoded command signals from the interface semiconductor die 200 to the memory semiconductor die 300 and decoding the transferred command signals in the memory semiconductor die 300.

Figure 2:
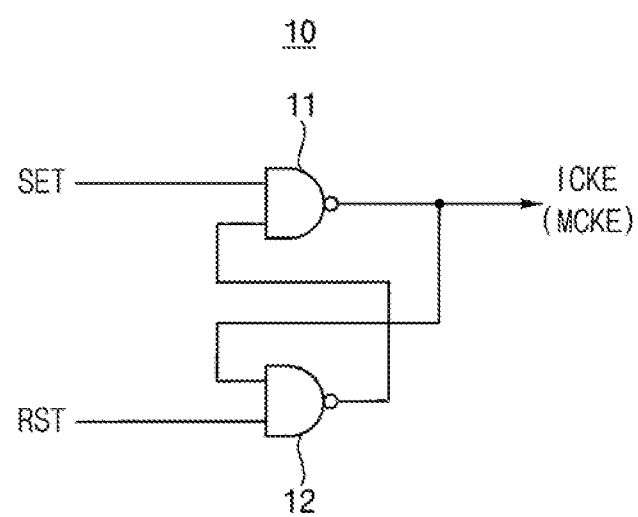
FIG. 2 is a diagram illustrating an example embodiment of a clock enable signal generator included in a semiconductor memory device according to example embodiments.

FIG. 2 is a diagram illustrating an example embodiment of a clock enable signal generator included in a semiconductor memory device according to example embodiments.

A clock enable signal generator 10 in FIG. 2 may be included in each of the interface semiconductor die 200 and the memory semiconductor die 300 in FIG. 1. The clock enable signal generator 10 included in the interface semiconductor die 200 may generate the interface clock enable signal ICKE, and the clock enable signal generator 10 included in the memory semiconductor die 300 may generate the memory clock enable signal MCKE.

In some example embodiments, the clock enable signal generator 10 may be included in each of the interface command decoder ICDEC and the memory command decoder MCDEC. In some example embodiments, the clock enable signal generator 10 may be disposed outside the interface command decoder ICDEC and the memory command decoder MCDEC.

Referring to FIG. 2, the clock enable signal generator 10 may be implemented with a set-reset latch circuit, which may include a first NAND gate 11 and a second NAND gate 12.

The first NAND gate 11 performs a NAND logic operation on a set signal SET and an output of the second NAND gate 12, to generate the interface clock enable signal ICKE (or the memory clock enable signal MCKE). The second NAND gate 12 performs a NAND logic operation on a reset signal RST and an output of the first NAND gate 11.

The set signal SET and the reset signal RST may be generated (using a decoding logic as will be described below with reference to FIGS. 18 and 20) by decoding selected command signals corresponding to a portion of the plurality of command signals SCM1~SCMn, for example, by decoding row command-address signals R0, R1, and R2.

The decoding logic included in the interface command decoder ICDEC may generate the set signal SET and the reset signal RST based on the selected command signals transferred through selected command pins from the memory controller. The clock enable signal generator 10 included in the interface semiconductor die 200 may generate the interface clock enable signal ICKE based on the set signal SET and the reset signal RST.

The decoding logic included in the memory command decoder MCDEC may generate the set signal SET and the reset signal RST based on the selected command signals transferred through selected internal command paths from the interface semiconductor die 200. The clock enable signal generator 10 included in the memory semiconductor die 300 may generate the memory clock enable signal MCKE based on the set signal SET and the reset signal RST.

The interface command decoder ICDEC and the memory command decoder MCDEC may generate the interface clock enable signal ICKE and the memory clock enable signal MCKE independently of each other.

Figure 3:
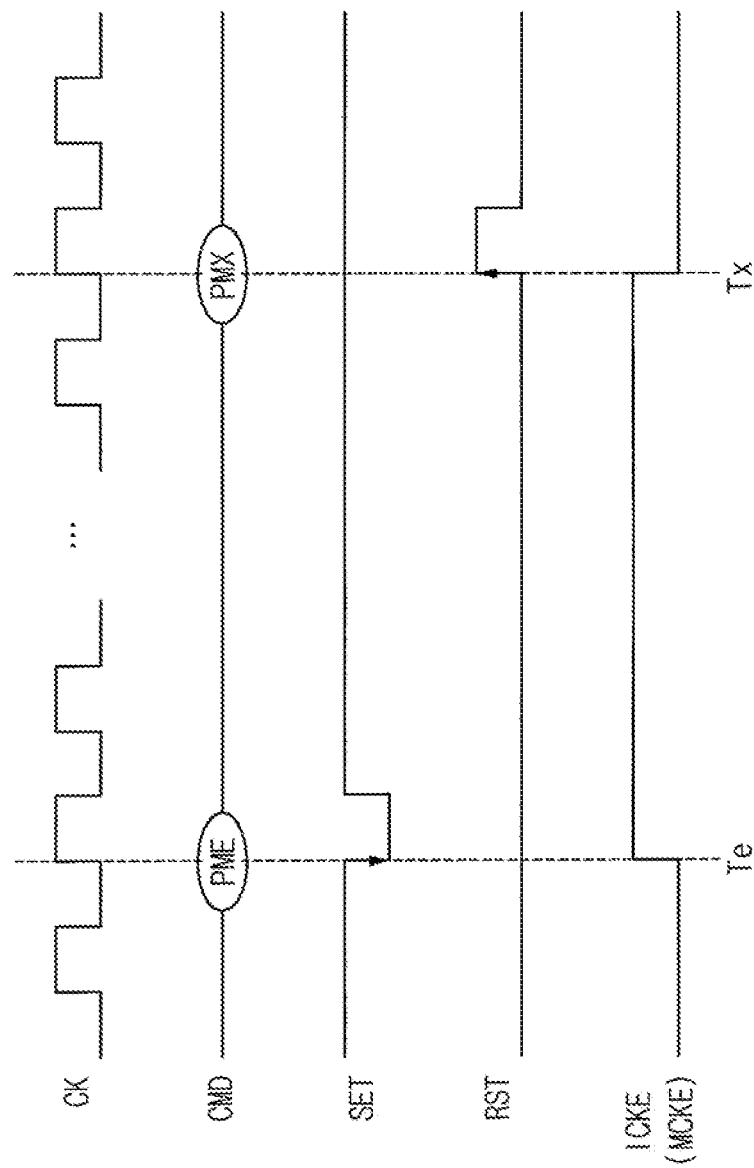
FIG. 3 is a timing diagram illustrating an operation of the clock enable signal generator of FIG. 2.

FIG. 3 is a timing diagram illustrating an operation of the clock enable signal generator of FIG. 2.

Referring to FIG. 3, the set signal SET may be activated in response to a power mode entry command PME (which may be one among commands CMD corresponding to combinations of the plurality of command signals SCM1~SCMn), and the reset signal RST may be activated in response to a power mode exit command PMX among the commands CMD. For example, the set signal SET may be activated in a logic low level, and the reset signal RST may be activated in a logic high level, as illustrated in FIG. 3. As will be described below, the power mode may include a power-down mode and/or a self-refresh mode.

The set-reset latch circuit 10 of FIG. 2 may deactivate each of the interface clock enable ICKE signal and the memory clock enable signal MCKE from the logic low level to the logic high level at a first time point Te corresponding to the falling edge of the set signal SET. The set-reset latch circuit 10 may activate each of the interface clock enable signal ICKE and the memory clock enable signal MCKE from the logic high level to the logic low level at a second time point Tx corresponding to the rising edge of the reset signal RST. The interface clock enable signal ICKE and the memory clock enable signal MCKE are activated in the logic low level in the example embodiment of FIGS. 2 and 3, but example embodiments are not limited thereto. As will be described below with reference to FIGS. 18 through 22, the set signal SET and the reset signal RST may be generated by decoding the command signals.

The set-reset latch circuit 10 included in each of the interface semiconductor die 200 and the memory semiconductor die 300 may deactivate each of the interface clock enable signal ICKE and the memory clock enable signal MCKE in response to the set signal SET, indicating the timing of the power mode entry command PME, and activate each of the interface clock enable signal ICKE and the memory clock enable signal MCKE in response to the reset signal RST, indicating the timing of the power mode exit command PMX.

Figure 4:
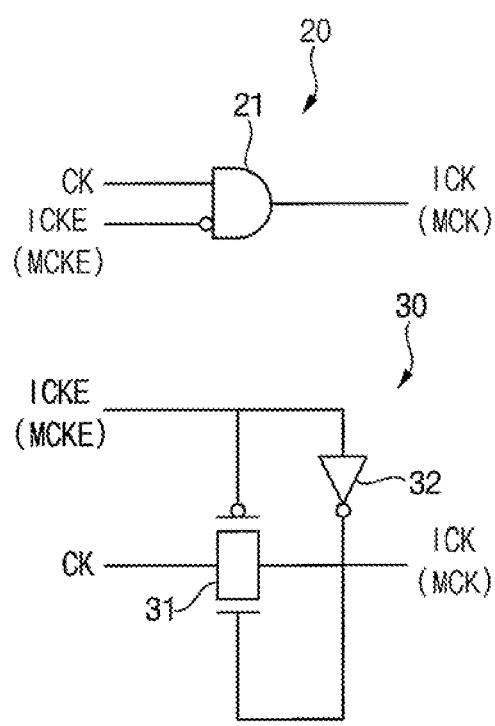
FIG. 4 is a diagram illustrating an example embodiment of a clock gating circuit included in a semiconductor memory device according to example embodiments.

FIG. 4 is a diagram illustrating an example embodiment of a clock gating circuit included in a semiconductor memory device according to example embodiments.

Clock gating circuits 20 and 30 in FIG. 4 may each be implemented as one or both of the interface clock gating circuit ICG and the memory clock gating circuit MCG, in FIG. 1.

The interface clock gating circuit ICG may receive the external clock signal CK transferred through the clock pin CKPN from the memory controller, and may gate the external clock signal CK based on the interface clock enable signal ICKE to provide the interface clock signal ICK for operations of the interface semiconductor die 200.

The memory clock gating circuit MCG may receive the external clock signal CK transferred through the internal clock path PTHC from the interface semiconductor die 200, and may gate the external clock signal CK based on the memory clock enable signal MCKE to provide the memory clock signal MCK for operations of the memory semiconductor die 300.

In some example embodiments, the clock gating circuit 20 may be implemented with an AND gate 21. The AND gate 21 may perform an AND logic operation on inputs of the external clock signal CK and an inverted signal of the interface clock enable signal ICKE (or an inverted signal of the memory clock enable signal MCKE), to provide an output of the interface clock signal ICK (or the memory clock signal MCK).

In some example embodiments, the clock gating circuit 30 may be implemented with a transmission gate 31 and an inverter 32. The transmission gate 31 may pass the external clock signal CK based on the interface clock enable signal ICKE (or based on the memory clock enable signal MCKE), to provide and output of the interface clock signal ICK (or the memory clock signal MCK).

Figure 5:
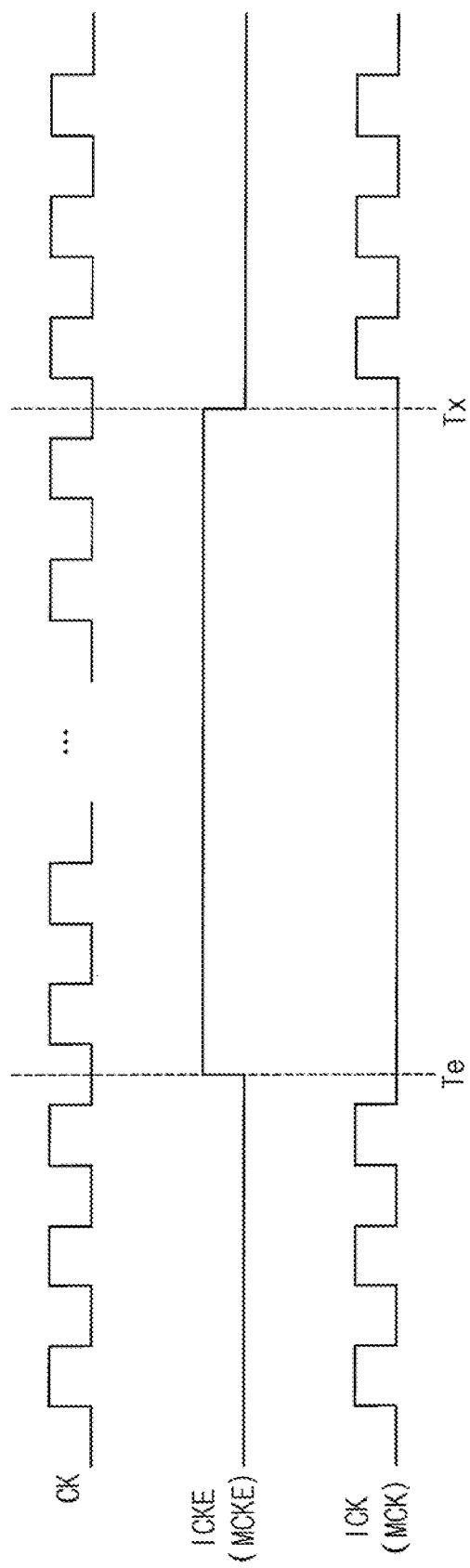
FIG. 5 is a timing diagram illustrating an operation of the clock gating circuit of FIG. 4.

FIG. 5 is a timing diagram illustrating an operation of the clock gating circuit of FIG. 4.

Referring to FIG. 5, the external clock signal CK may be blocked during a time duration Te to Tx while the interface clock enable signal ICKE (or the memory clock enable signal MCKE) is deactivated (for example, while the interface clock enable signal ICKE (or the memory clock enable signal MCKE) is the logic high level) using either of the clock gating circuits described above with reference to FIG. 4. That is, while the interface clock enable signal ICKE (or the memory clock enable signal MCKE) is deactivated, the interface clock signal ICK (or the memory clock signal MCK) may stop toggling, that is, may be deactivated.

As such, the interface clock enable signal ICKE and memory clock enable signal MCKE may be generated based on the set signal SET and the reset signal RST that are generated by decoding the command signals, and clock gating may be performed based on the interface clock enable signal ICKE and the memory clock enable signal MCKE.

As a result, the interface command decoder ICDEC and the memory command decoder MCDEC may control the clock supply with respect to the interface semiconductor die 200 and the memory semiconductor die 300, respectively, based on the command signals.

Figure 6:
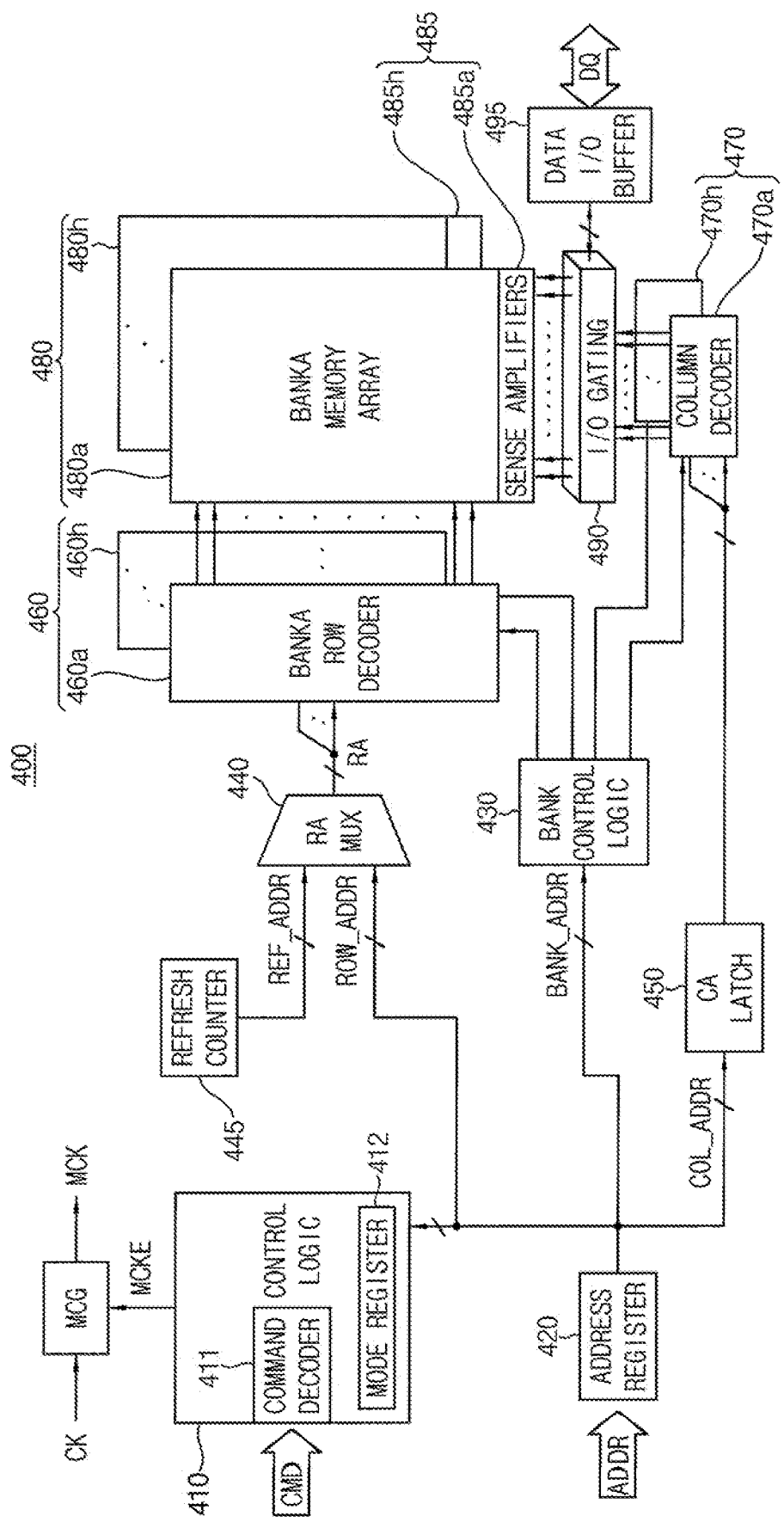
FIG. 6 is a diagram illustrating an example embodiment of a memory integrated circuit included in a semiconductor memory device according to example embodiments.

FIG. 6 is a diagram illustrating an example embodiment of a memory integrated circuit included in a semiconductor memory device according to example embodiments.

Although a dynamic random access memory (DRAM) is described as an example of the semiconductor memory device with reference to FIG. 6, the semiconductor memory device may be any of a variety of memory cell architectures, including, but not limited to, volatile memory architectures such as DRAM, thyristor RAM (TRAM), and static RAM (SRAM), or non-volatile memory architectures such as read only memory (ROM), flash memory, phase change RAM (PRAM), ferroelectric RAM (FRAM), magnetic RAM (MRAM), and the like.

Referring to FIG. 6, a memory integrated circuit 400 may include a control logic 410, an address register 420, a bank control logic 430, a row address multiplexer 440, a refresh counter 445, a column address latch 450, a row decoder 460, a column decoder 470, a memory cell array 480, a sense amplifier unit 485, an input/output (I/O) gating circuit 490, a data input/output (I/O) buffer 495, and a memory clock gating circuit MCG.

The memory cell array 480 may include a plurality of bank arrays 480a~480h. The row decoder 460 may include a plurality of bank row decoders 460a~460h respectively coupled to the bank arrays 480a~480h. The column decoder 470 may include a plurality of bank column decoders 470a~470h respectively coupled to the bank arrays 480a~480h. The sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR, and a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the I/O gating circuit 490 to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data DQ to be read from one bank array of the bank arrays 480a~480h may be sensed by the sense amplifier unit 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory integrated circuit 400. For example, the control logic 410 may generate control signals for the memory integrated circuit 400 to perform a write operation or a read operation. The control logic 410 may include a command decoder 411, which decodes a command CMD received from the memory controller, and a mode register set 412, which sets an operation mode of the memory integrated circuit 400. For example, the command decoder 411 may generate the control signals corresponding to the command CMD by decoding command signals.

According to example embodiments, the command decoder 411 may generate the memory clock enable signal MCKE based on the command signals as described above. The memory clock gating circuit MCG may receive the external clock signal CK transferred from the interface semiconductor die, and may gate the external clock signal CK based on the memory clock enable signal MCKE to provide the memory clock signal MCK for operations of the memory integrated circuit 400.

Figure 7:
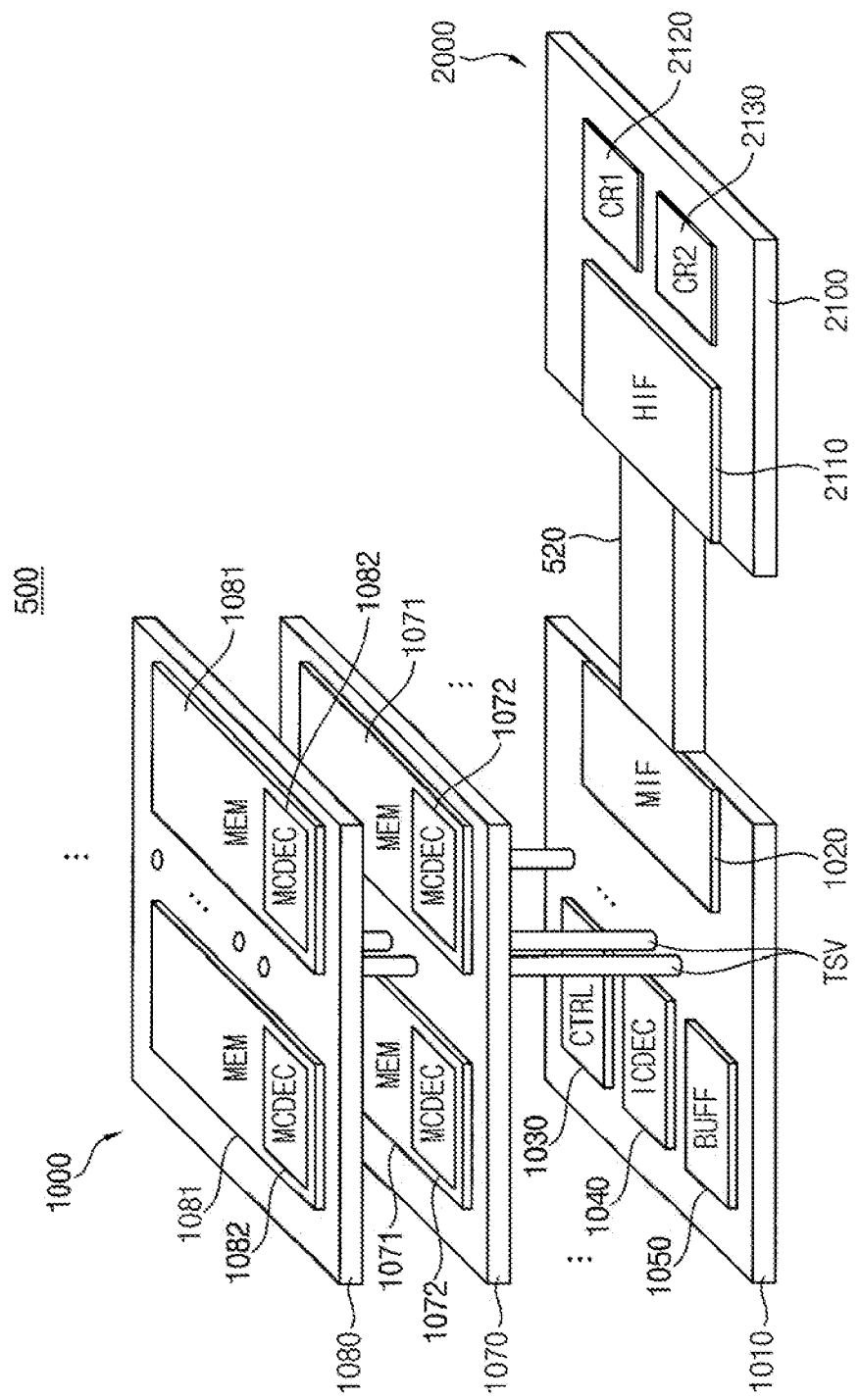
FIG. 7 is an exploded, perspective view, of a system including a stacked memory device according to example embodiments.

FIG. 7 is an exploded, perspective view, of a system including a stacked memory device according to example embodiments.

Referring to FIG. 7, a system 500 may include a stacked memory device 1000 and a host device 2000.

The stacked memory device 1000 may include an interface semiconductor die 1010 (which may be referred to as a buffer semiconductor die or a logic semiconductor die), a plurality of memory semiconductor dies 1070 and 1080 stacked with the buffer semiconductor die 1100, and through-silicon vias TSV electrically connecting the semiconductor dies 1010, 1070, and 1080. The memory semiconductor dies 1070 and 1080 may include memory integrated circuits MEM 1071 and 1081, respectively.

FIG. 7 illustrates a non-limiting example of one interface semiconductor die and two memory semiconductor dies. However, two or more logic semiconductor dies and one, three or more memory semiconductor dies may be included in the stack structure of FIG. 7. In addition, FIG. 7 illustrates a non-limiting example in that the memory semiconductor dies 1070 and 1080 are vertically stacked with the interface semiconductor die 1010. However, as will be described below with reference to FIG. 23, the memory semiconductor dies 1070 and 1080 may be stacked vertically and the interface semiconductor die 1010 may not be stacked with the memory semiconductor dies 1070 and 1080, but may be electrically connected to the memory semiconductor dies 1070 and 1080 through an interposer and/or a base substrate.

The interface semiconductor die 1010 may include a memory interface MIF 1020, a control circuit CTRL 1030, an interface command decoder ICDEC 1040, and a data buffer 1050.

The memory interface 1020 may perform communication with an external device such as the host device 2000 through an interconnect device 520. The control circuit 1030 may control overall operations of the stacked memory device 1000. The interface command decoder 1040 may generate internal control signals by decoding a plurality of command signals transferred from the host device 2000. In the present example embodiment, the memory interface 1020 does not include a clock enable pin, and may include command pins, data pins, and control pins. The data buffer 1050 may temporarily store the data exchanged with the host device 2000. In addition, the data buffer may store information for controlling the stacked memory device 1000.

The host device 2000 may include a host interface HIF 2110 and processor cores CR1 2120 and CR2 2130. The host interface 2110 may perform communication with an external device such as the stacked memory device 1000 through the interconnect device 520. The host interface 2110 may include a memory controller to control the stacked memory device 1000.

Figure 8:
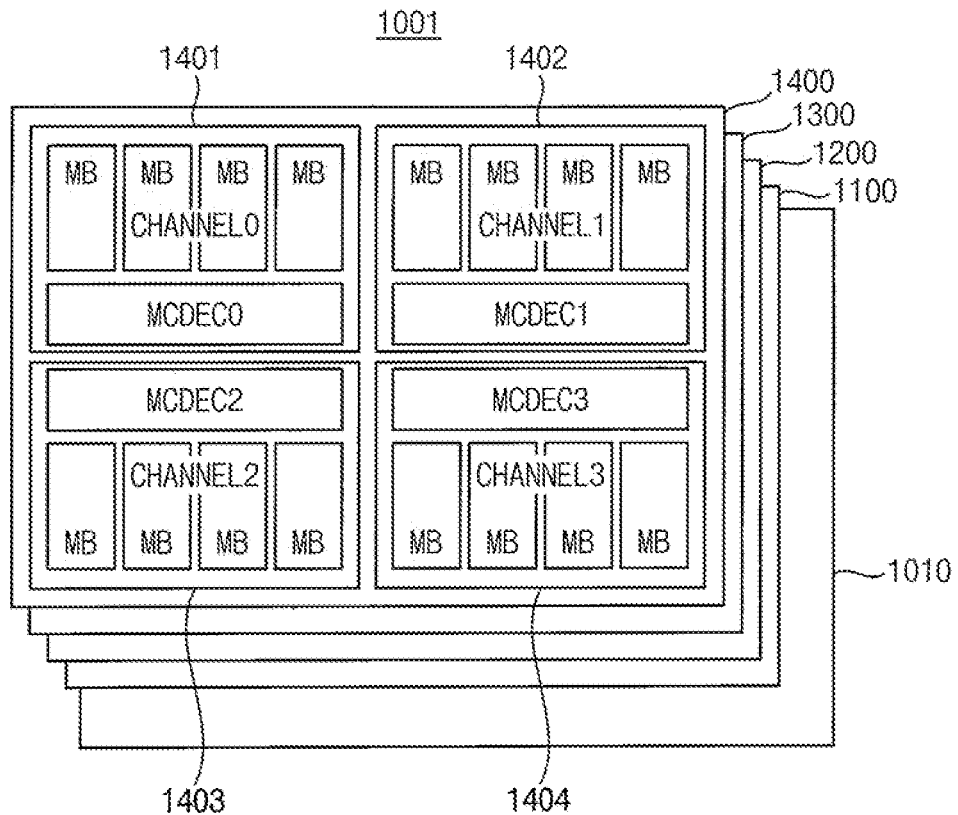
FIG. 8 is a diagram illustrating a high bandwidth memory (HBM) device according to example embodiments.

FIG. 8 is a diagram illustrating a high bandwidth memory (HBM) device according to example embodiments.

Referring to FIG. 8, a HBM device 1001 may include a stack of multiple DRAM semiconductor dies 1100, 1200, 1300, and 1400. The HBM device 1001 having the stack structure may be optimized by a plurality of independent interfaces called channels. Each DRAM stack may support up to 8 channels in accordance with the HBM standards. FIG. 8 shows an example stack containing 4 DRAM semiconductor dies 1100, 1200, 1300, and 1400, and each DRAM semiconductor die supports four channels CHANNEL0~CHANNEL3. For example, as illustrated in FIG. 8, the fourth memory semiconductor die 1400 may include four memory integrated circuits 1401~1404 respectively corresponding to the four channels CHANNEL0~CHANNEL3. The four memory integrated circuits 1401~1404 may include four memory command decoders MCDEC0~MCDEC3 as described above, respectively.

In some example embodiments, each of the four channels CHANNEL0~CHANNEL3 may be divided into two pseudo-channels. In this case, one memory semiconductor die may include eight memory command decoders respectively corresponding to eight pseudo-channels.

Each channel of the HBM device 1001 may provide access to an independent set of DRAM banks. Requests from one channel may not access data attached to a different channel. Channels may be independently clocked, and need not be synchronous.

The HBM device 1001 may further include an interface semiconductor die 1010 disposed at bottom of the stack structure to provide signal routing and/or other functions.

Figure 9:
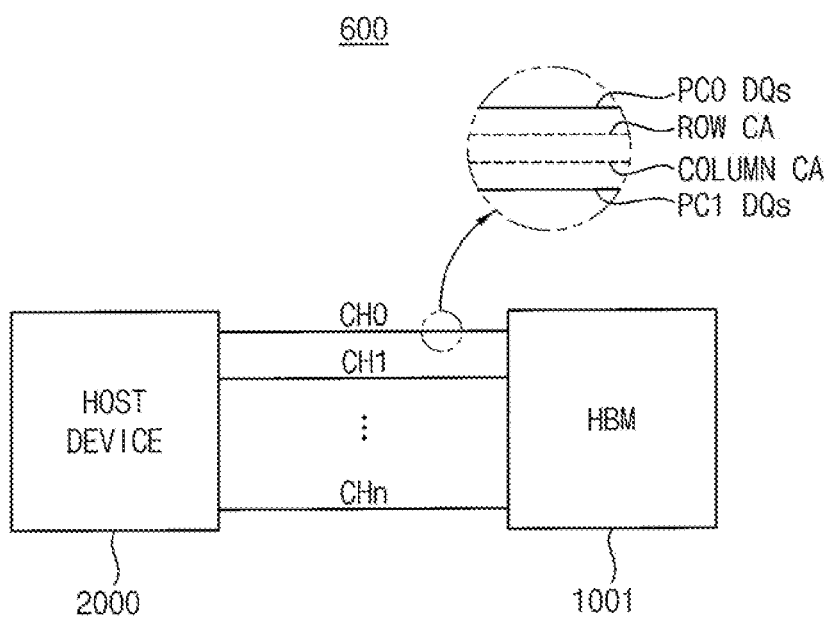
FIG. 9 is a diagram illustrating an example interface of a system including an HBM device according to example embodiments.

FIG. 9 is a diagram illustrating an example interface of a system including an HBM device according to example embodiments.

Referring to FIG. 9, a system 600 may include the HBM device 1001 and the host device 2000 that are connected through a plurality of channels CH0~CHn. Each of the channels CH0~CHn may include two pseudo-channels PC0 and PC1. For example, as illustrated in FIG. 9, signal lines corresponding to one channel CH0 may include data lines PC0 DQs of the first pseudo-channel PC0, data lines PC1 DQs of the second pseudo-channel PC1, and command-address lines CA, which may include a row command-address lines ROW CA (for transferring an active command, a precharge command, etc.) and a column command-address lines COLUMN CA (for transferring a read command, a write command, etc.).

The typical memory channel includes a command-address (CA) interface and a data (DQ) interface, which may be controlled independently of those of other channels. The pseudo-channel may include the independent DQ interface and the shared CA interface as illustrated in FIG. 9. The pseudo-channels may be selected by a time-division scheme, and a respective command and address may be transferred though the pseudo-channels corresponding to the same memory channel. In this disclosure, "channel" indicates "pseudo-channel" that may be controlled independently.

For example, in case of a 4H-HBM device including four stacked memory semiconductor dies, each memory semiconductor die may include four channels or eight pseudo-channels, and each pseudo-channel may include 16 memory banks. Thus, each memory semiconductor die may include 128 memory banks, and the 128 memory banks may be divided into eight pseudo-channels. The 4H-HBM device may include 16 memory command decoders corresponding to 16 channels or 32 memory command decoders corresponding to 32 pseudo-channel s.

FIGS. 10 and 11 are diagrams illustrating an example embodiment of commands of an HBM device according to example embodiments.

FIG. 10 illustrates a row no operation command RNOP, an active or activate command ACT and a power-down entry command PDE, a self-refresh entry command SRE, a power-down exit command PDX, and a self-refresh exit command SRX that are transferred through the row command-address lines ROW CA in FIG. 9.

FIG. 11 illustrates a column no operation command CNOP, a read command RD, a write command WR, and mode register set command MRS that are transferred through the column command-address lines COLUMN CA in FIG. 9.

Referring to FIGS. 10 and 11, the plurality of command signals SCM1~SCMn as described with reference to FIG. 1 may include a plurality of row CA signals R0~R9 and a plurality of column CA signals C0~C7. Commands and addresses transferred from the host device to the HBM device may be represented by a combination of the row CA signals R0~R9 and the column CA signals C0~C7. 'H' indicates a logic high level, 'L' indicates a logic low level, RA0~RA15 indicate bits of a row address, BA0~BA3 indicate bits of a bank address, 'V' indicates any of the logic high level or the logic low level, CA0~CA4 indicate bits of a column address, SID indicates an identifier of a memory semiconductor die, and PC indicates a pseudo-channel.

For example, the active command ACT may be transferred during 1.5 clock cycles including two rising edges R and one falling edge F, whereas the read command RD and the write command WR may be transferred during one clock cycle. The active command ACT may include the bank address bits BA0~BA3 and the row address bits RA0~RA15. The read command RD and the write command WR may include the bank address bits BA0~BA3 and the column address bits CA0~CA4.

The combinations of the command-address signal illustrated in FIGS. 10 and 11 are non-limiting examples, and various combinations may be utilized.

Figure 12:
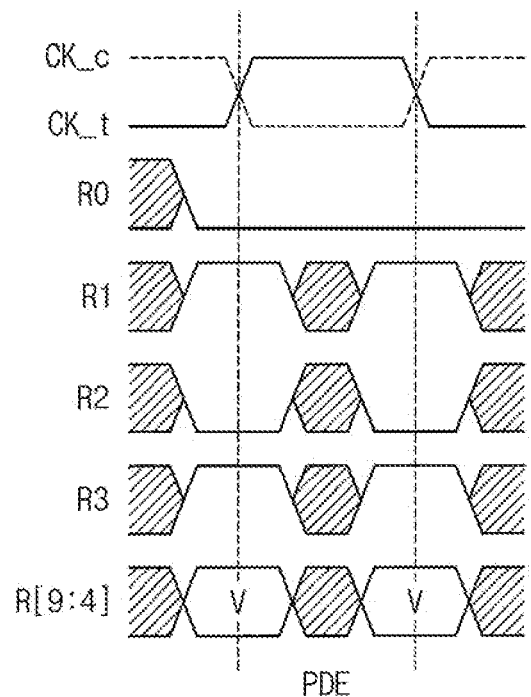
FIGS. 12, 13, and 14 are diagrams illustrating power mode commands included in the commands of FIG. 10.
Figure 13:
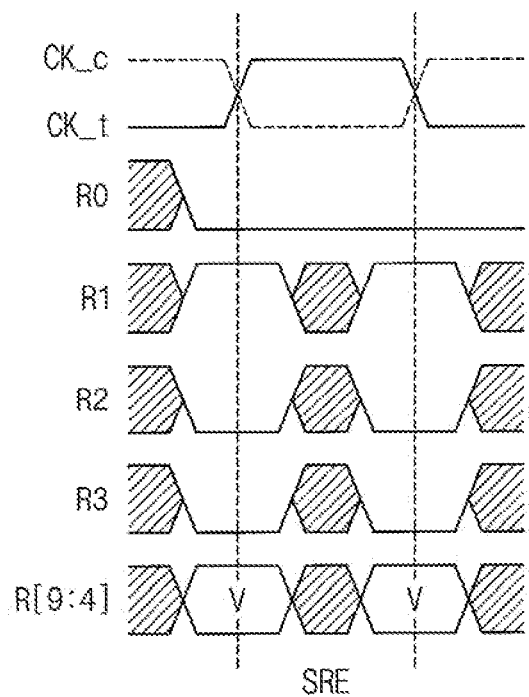
Figure 14:
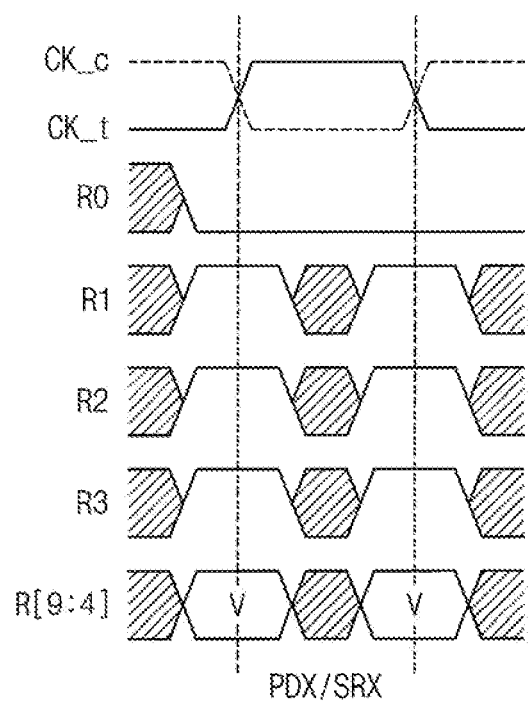

FIGS. 12, 13, and 14 are diagrams illustrating power mode commands included in the commands of FIG. 10.

FIG. 12 illustrates the power-down entry command PDE, FIG. 13 illustrates the self-refresh entry command SRE, and FIG. 14 illustrates the power-down exit command PDX and the self-refresh exit command SRX. As illustrated in FIGS. 10 and 14, the power-down exit command PDX and the self-refresh exit command SRX may be equal to each other.

The power mode commands PDE, SRE, PDX, and SRX may be decoded by sampling (in synchronization with the edges of an external clock signal CK_t) the logic levels of the row CA signals R0~R3 corresponding to a portion of the plurality of command signals SCM1~SCMn in FIG. 1. The external clock signal CK_t may be provided from the memory controller, with a complementary clock signal CK_c as a differential signal pair, but example embodiments are not limited thereto.

Figure 15:
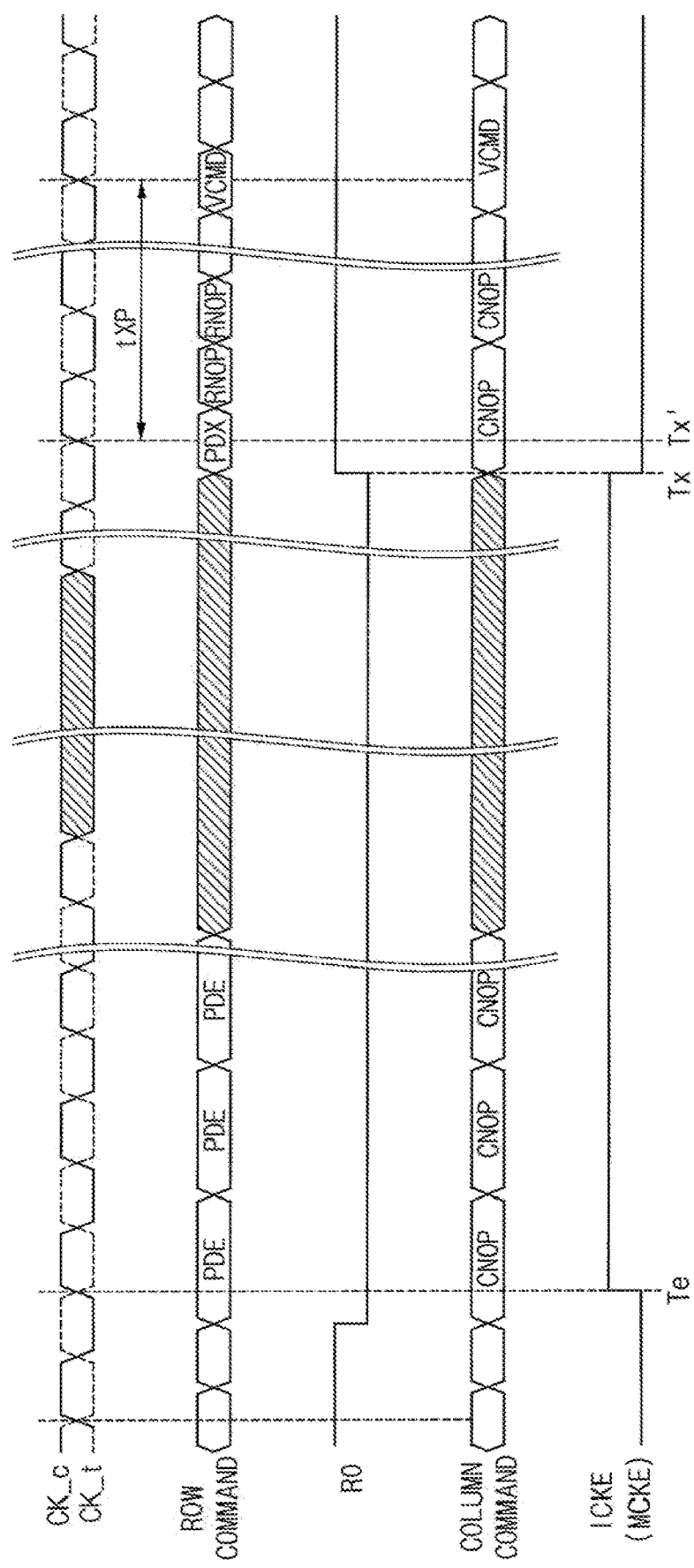
FIGS. 15 and 16 are timing diagrams illustrating entrance and exit of a power mode in an HBM device according to example embodiments.
Figure 16:
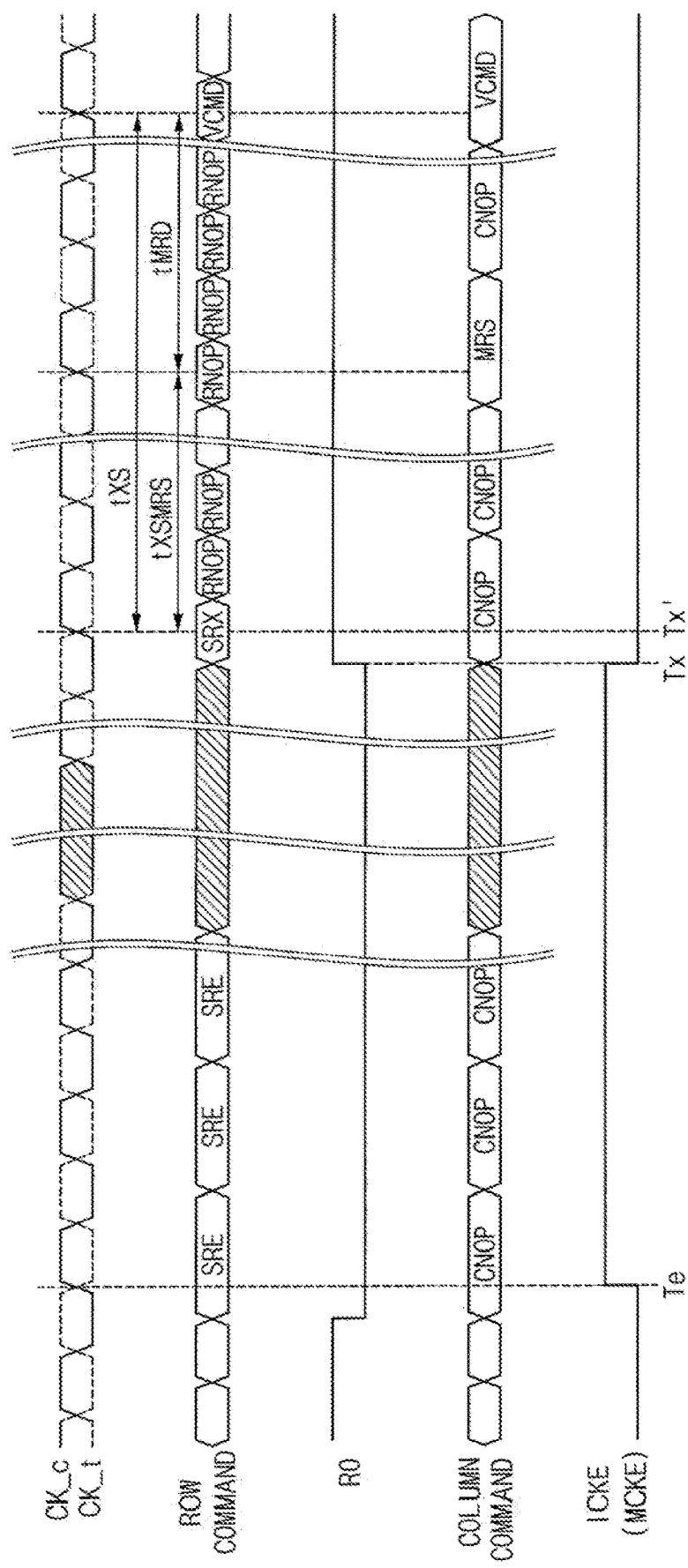

FIGS. 15 and 16 are timing diagrams illustrating entrance and exit of a power mode in an HBM device according to example embodiments.

FIG. 15 illustrates entry and exit of the power-down mode, and FIG. 16 illustrates entry and exit of the self-refresh mode. In FIGS. 15 and 16, RNOP indicates the row no operation command, CNOP indicates the column no operation command, and VCMD indicates any valid command.

Referring to FIG. 15, the above-described power mode command may include a power-down entry command PDE and a power-down exit command PDX.

The interface command decoder ICDEC in FIG. 1 may deactivate the interface clock enable signal ICKE in response to the timing of the power-down entry command PDE, that is, at a time point Te, and activate the interface clock enable signal ICKE in response to the timing of the power-down exit command PDX.

The memory command decoder MCDEC in FIG. 1 may deactivate the memory clock enable signal MCKE in response to the timing of the power-down entry command PDE, that is, at the time point Te, and activate the memory clock enable signal MCKE in response to the timing of the power-down exit command PDX.

The valid command VCMD may be transferred from the memory controller after a predetermined time interval tXP from the timing of the power-down exit command PDX. In some example embodiments, the timing of the power-down exit command PDX may correspond to a time point Tx, that is, the rising edge of the power-down exit command PDX. In some example embodiments, the timing of the power-down exit command PDX may correspond to a time point Tx', that is, the rising edge of the external clock signal CK_t at which the power-down exit command PDX is sampled.

Referring to FIG. 16, the above-described power mode command may include a self-refresh entry command SRE and a self-refresh exit command SRX.

The interface command decoder ICDEC in FIG. 1 may deactivate the interface clock enable signal ICKE in response to the timing of the self-refresh entry command SRE, that is, at a time point Te, and activate the interface clock enable signal ICKE in response to the timing of the self-refresh exit command SRX.

The memory command decoder MCDEC in FIG. 1 may deactivate the memory clock enable signal MCKE in response to the timing of the self-refresh entry command SRE, that is, at the time point Te, and activate the memory clock enable signal MCKE in response to the timing of the self-refresh exit command SRX.

The valid command VCMD may be transferred from the memory controller after a predetermined time interval tXS from the timing of the self-refresh exit command SRX. In some example embodiments, the timing of the self-refresh exit command SRX may correspond to a time point Tx, that is, the rising edge of the self-refresh exit command SRX. In some example embodiments, the timing of the self-refresh exit command SRX may correspond to a time point Tx', that is, the rising edge of the external clock signal CK_t at which the self-refresh exit command SRX is sampled.

In FIG. 16, tXSMRS indicates a delay time from the self-refresh exit command SRX to the mode register set command MRS, and tMRD indicates a time interval required to write the information of the mode register set command MRS in the mode register.

Figure 17:
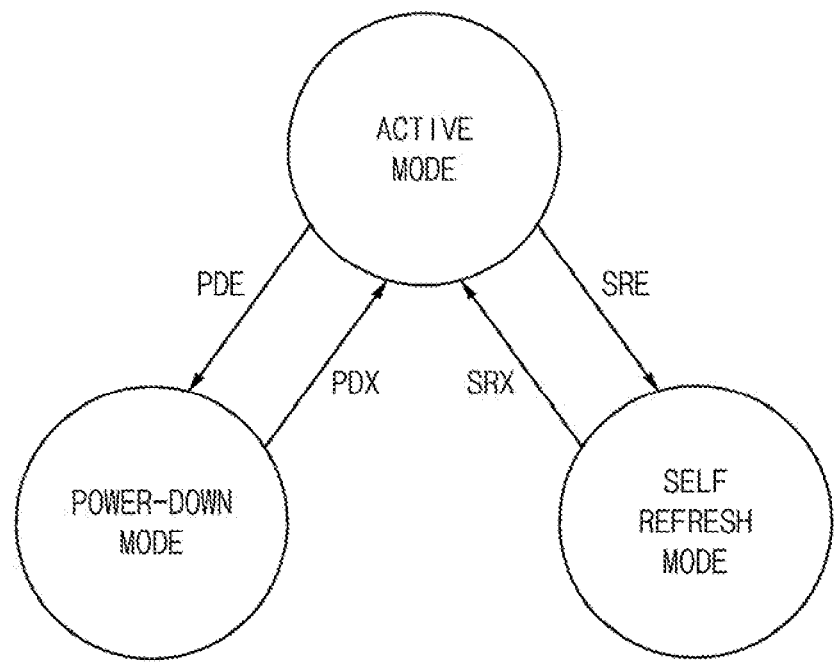
FIG. 17 is a diagram illustrating transition of an operation mode in an HBM device according to example embodiments.

FIG. 17 is a diagram illustrating transition of an operation mode in an HBM device according to example embodiments.

Referring to FIG. 17, the HBM device may enter the power-down mode from the active mode in response to the power-down entry command PDE, and may exit from the power-down mode to the active mode in response to the power-down exit command PDX.

In the power-down mode, the clock signal provided to internal circuits of the memory semiconductor die of HBM device may be deactivated, and power provided to most of the internal circuits may be blocked.

In some example embodiments, the HBM device may enter the self-refresh mode from the active mode in response to the self-refresh entry command SRE, and may exit from the self-refresh mode to the active mode in response to the self-refresh exit command SRX.

In the self-refresh mode, the clock signal provided to internal circuits of the memory semiconductor die of HBM device may be deactivated, and the memory semiconductor die may perform a refresh operation by itself without receiving a refresh command and a refresh address from the memory controller.

Figure 18:
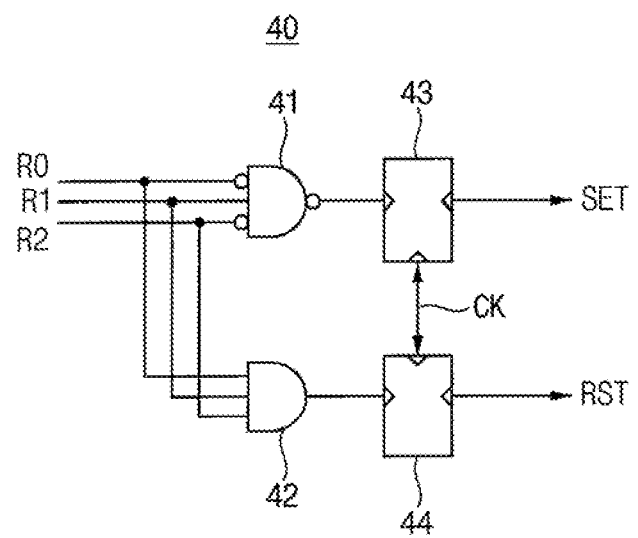
FIG. 18 is a diagram illustrating an example embodiment of a decoding logic included in a command decoder of an HBM according to example embodiments.

FIG. 18 is a diagram illustrating an example embodiment of a decoding logic included in a command decoder of an HBM according to example embodiments.

Each of the interface command decoder ICDEC and the memory command decoder MCDEC in FIG. 1 may include a decoding logic 40 as illustrated in FIG. 18.

The decoding logic 40 included in the interface command decoder ICDEC may generate the set signal SET and the reset signal RST based on selected command signals transferred through selected command pins corresponding a portion of the plurality of command pins CPN1~CPNn in FIG. 1. In addition, the decoding logic 40 included in the memory command decoder MCDEC may generate the set signal SET and the reset signal RST based on the selected command signals transferred through selected internal command paths corresponding a portion of the plurality of internal command paths PTH1~PTHn in FIG. 1. Thus, the selected command signals correspond to a portion of the plurality of command signals SCM1~SCMn. As such, the interface command decoder ICDEC and the memory command decoder MCDEC may generate the set signal SET and the reset signal RST independently of each other.

Referring to FIG. 18, the decoding logic 40 may include a first logic gate 41, a second logic gate 42, a first flip-flop 43, and a second flip-flop 44.

The first logic gate 41 may perform a first logic operation on selected command signals R0, R1, and R2 corresponding a portion of the plurality of command signals R0~R9 and C0~C7 as illustrated in FIGS. 10 and 11. The second logic gate 42 may perform a second logic operation on the selected command signals R0, R1, and R2. For example, the first logic gate 41 may be implemented with a NAND gate and the second logic gate 42 may be implemented with an AND gate.

The first flip-flop 43 may latch an output of the first logic gate 41 in response to the external clock signal CK transferred from the memory controller, to generate the set signal SET. The second flip-flop 44 may latch an output of the second logic gate 42 in response to the external clock signal CK, to generate the reset signal RST. The decoding logic 40 may generate the set signal SET and the reset signal RST as described with reference to FIG. 3. As a result, the interface command decoder ICDEC may generate the interface clock enable signal ICKE based on the selected command signals R0, R1, and R2 corresponding to a portion of the plurality of command signals, and the memory command decoder MCDEC may generate the memory clock enable signal MCKE based on the selected command signals R0, R1, and R2.

Figure 19:
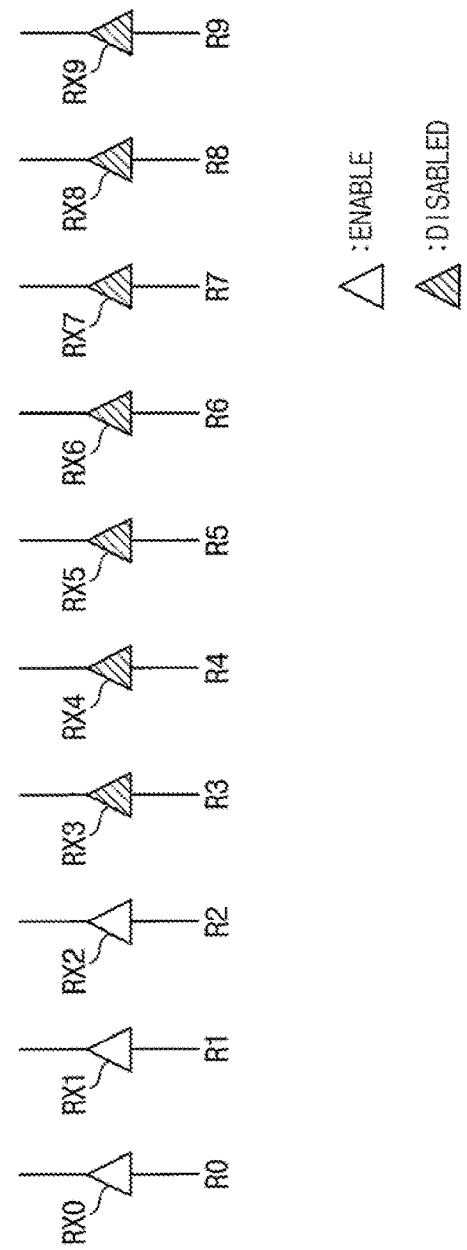
FIG. 19 is a diagram illustrating an operation of a power mode in an HBM device according to example embodiments.

FIG. 19 is a diagram illustrating an operation of a power mode in an HBM device according to example embodiments.

Referring to FIG. 19, the interface semiconductor die may deactivate, among the plurality of command pins corresponding to the row CA signals R0~R9, other command pins except selected command pins corresponding to the selected command signals R0, R1, and R2 in response to deactivation of the interface clock enable signal ICKE. As illustrated in FIG. 19, the other command pins corresponding to the row CA signals R3~R9 may be deactivated by disabling the command receivers RX3~RX9 and not disabling the command receivers RX0~RX2 corresponding to the selected command pins.

The interface semiconductor die may again activate the other command pins corresponding to the command signals R3~R9 in response to activation of the interface clock enable signal ICKE.

Figure 20:
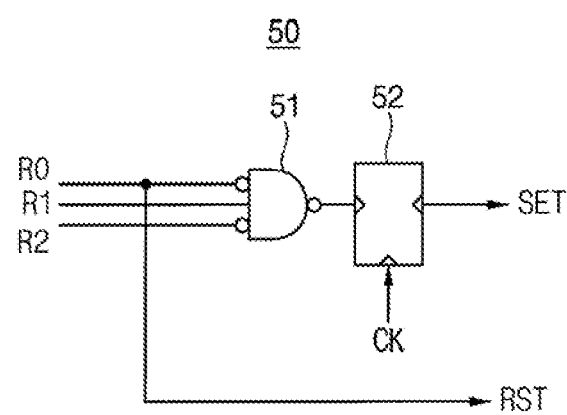
FIG. 20 is a diagram illustrating an example embodiment of a decoding logic included in a command decoder of an HBM according to example embodiments.

FIG. 20 is a diagram illustrating an example embodiment of a decoding logic included in a command decoder of an HBM according to example embodiments.

Each of the interface command decoder ICDEC and the memory command decoder MCDEC in FIG. 1 may include a decoding logic 50 as illustrated in FIG. 20.

The decoding logic 50 included in the interface command decoder ICDEC may generate the set signal SET and the reset signal RST based on selected command signals transferred through selected command pins corresponding a portion of the plurality of command pins CPN1~CPNn in FIG. 1.

The decoding logic 50 included in the memory command decoder MCDEC may generate the set signal SET and the reset signal RST based on the selected command signals transferred through selected internal command paths corresponding a portion of the plurality of internal command paths PTH1~PTHn in FIG. 1.

The selected command signals correspond to a portion of the plurality of command signals SCM1~SCMn.

The interface command decoder ICDEC and the memory command decoder MCDEC may generate the set signal SET and the reset signal RST independently of each other.

The decoding logic 50 may include a logic gate 51 and a flip-flop 52. The logic gate 51 may perform a logic operation on selected command signals R0, R1, and R2 corresponding a portion of the plurality of command signals R0~R9 and C0~C7 as illustrated in FIGS. 10 and 11. The logic gate 51 may be implemented with a NAND gate. The flip-flop 52 may latch an output of the logic gate 51 in response to the external clock signal CK transferred from the memory controller, to generate the set signal SET. In addition, the decoding logic 50 may provide one command signal R0 among the selected command signals R0, R1, and R2 as the reset signal RST.

Figure 21:
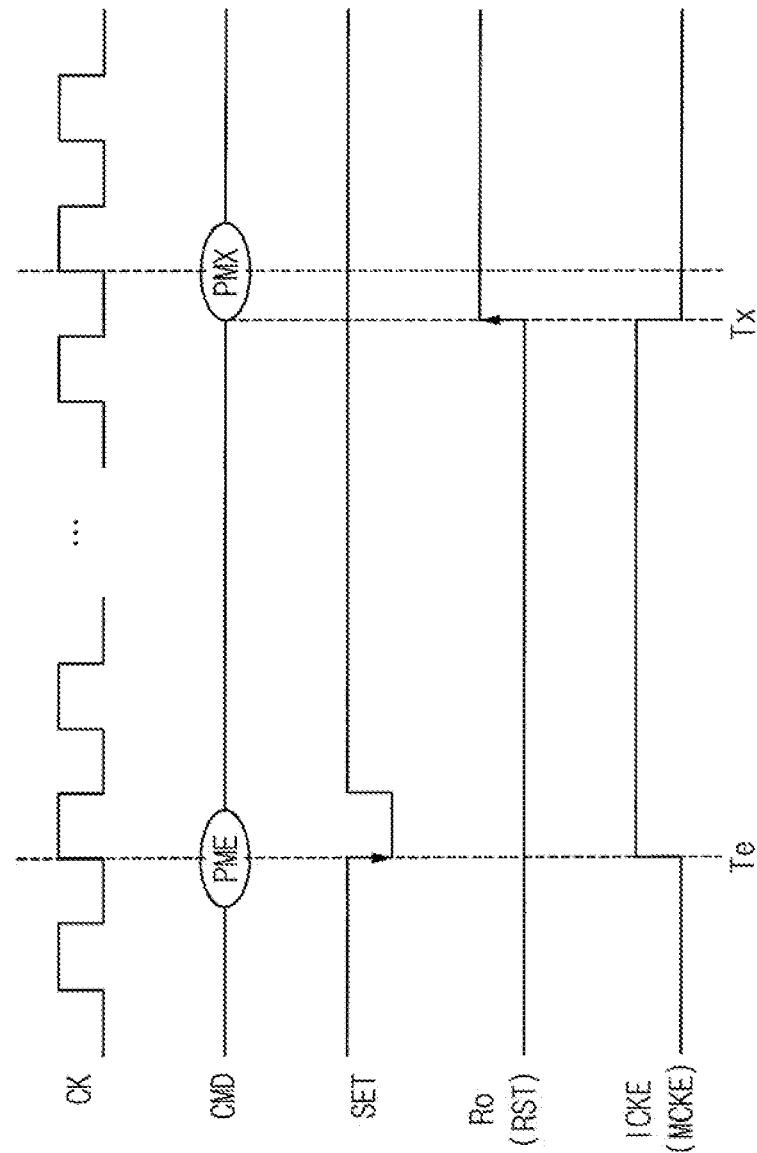
FIG. 21 is a timing diagram illustrating an operation of the clock enable signal generator of FIG. 2.

FIG. 21 is a timing diagram illustrating an operation of the clock enable signal generator of FIG. 2.

Referring to FIG. 21, the set signal SET may be activated in response to a power mode entry command PME (among commands CMD corresponding to combinations of the plurality of command signals) and the reset signal RST may be activated in response to the one command signal R0, as described with reference to FIG. 20. For example, as shown in FIG. 21, the set signal SET may be activated in the logic low level. As described above, the power mode may include the power-down mode and/or the self-refresh mode.

The set-reset latch circuit 10 of FIG. 2 may deactivate the interface clock enable ICKE signal (or the memory clock enable signal MCKE) from the logic low level to the logic high level at a first time point Te corresponding to the falling edge of the set signal SET. The set-reset latch circuit 10 may activate the interface clock enable signal ICKE (or the memory clock enable signal MCKE) from the logic high level to the logic low level at a second time point Tx corresponding to the rising edge of the reset signal RST.

As such, the interface command decoder ICDEC and the memory command decoder MCDEC may respectively deactivate the interface clock enable signal ICKE and the memory clock enable signal MCKE in response to the selected command signals R0, R1, and R2 corresponding to a portion of a plurality of command signals, and may respectively activate the interface clock enable signal ICKE and the memory clock enable signal MCKE in response to the one command signal R0 among the selected command signals R0, R1, and R2.

Figure 22:
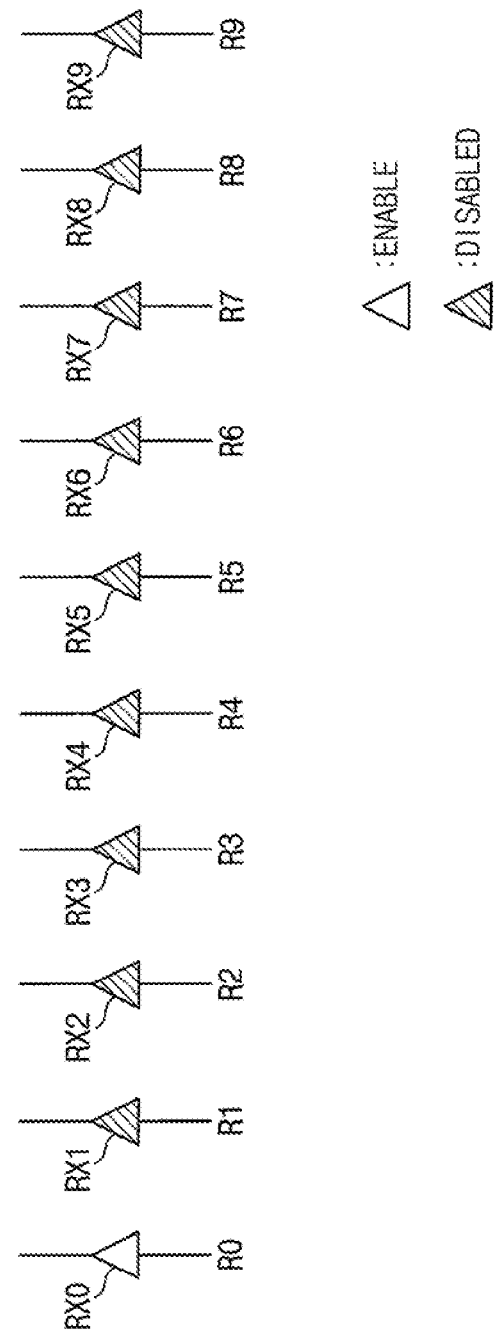
FIG. 22 is a diagram illustrating an operation of a power mode in an HBM device according to example embodiments.

FIG. 22 is a diagram illustrating an operation of a power mode in an HBM device according to example embodiments.

Referring to FIG. 22, the interface semiconductor die may deactivate, among the plurality of command pins corresponding to the row CA signals R0~R9, other command pin except one command pin corresponding to the one command signal R0 in response to deactivation of the interface clock enable signal ICKE. As illustrated in FIG. 22, the other command pins corresponding to the row CA signals R1~R9 may be deactivated by disabling the command receivers RX1~RX9, except the one command receiver RX0 corresponding to the one command pin.

The interface semiconductor die may again activate the other command pins corresponding to the command signals R1~R9 in response to activation of the interface clock enable signal ICKE.

Figure 23:
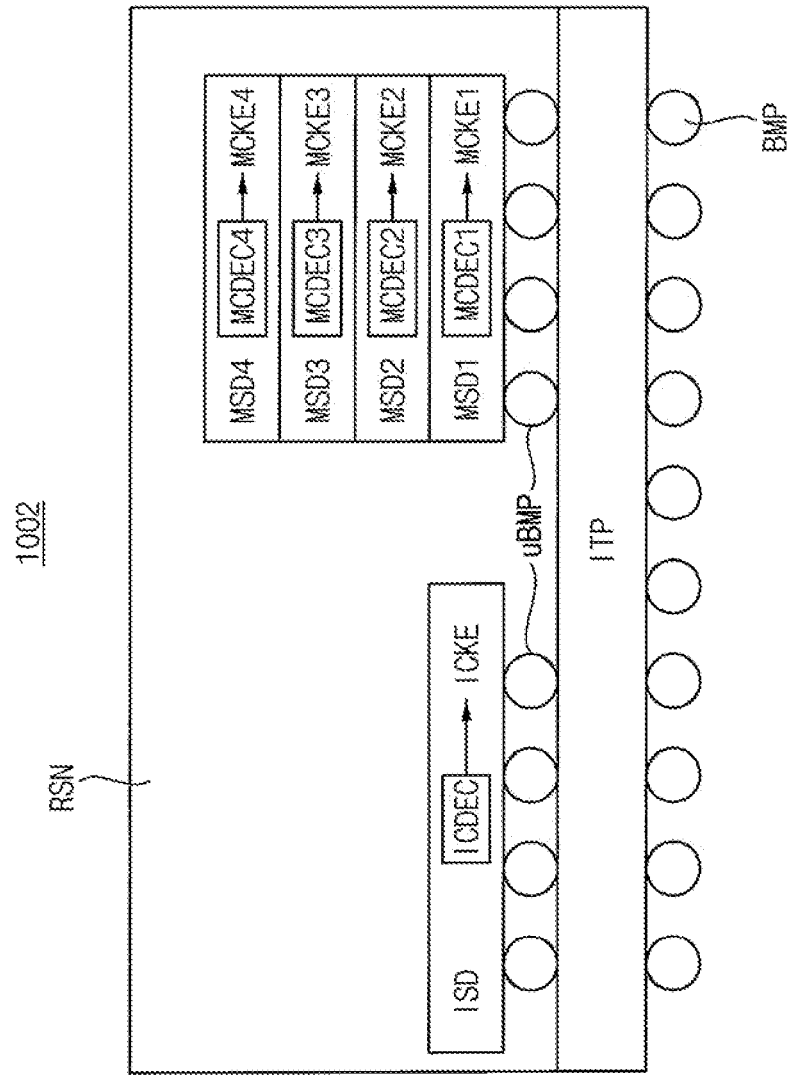
FIGS. 23 and 24 are diagrams illustrating packaging structures of a stacked memory device according to example embodiments.
Figure 24:
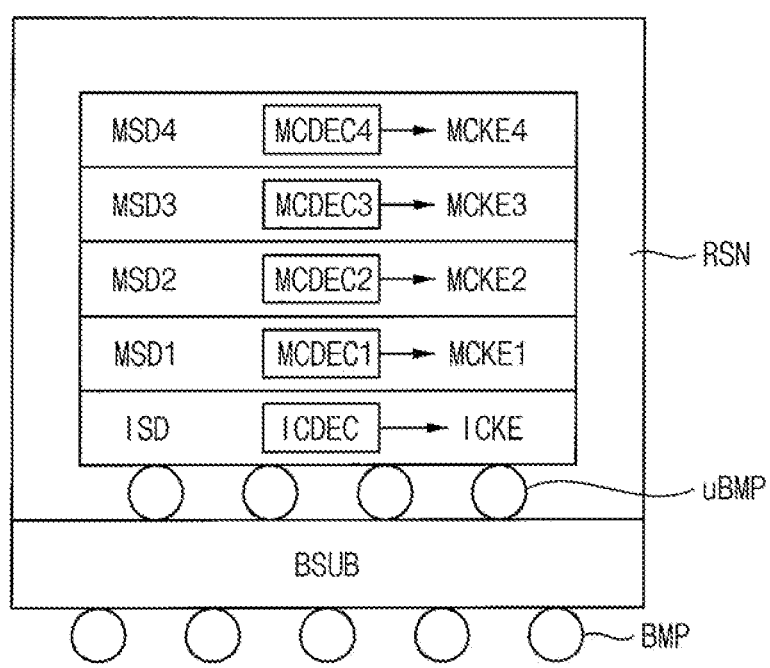

FIGS. 23 and 24 are diagrams illustrating packaging structures of a stacked memory device according to example embodiments.

Referring to FIG. 23, a memory chip 1002 may include an interposer ITP and a stacked memory device stacked on the interposer ITP. The stacked memory device may include an interface semiconductor die ISD and a plurality of memory semiconductor dies MSD1~MSD4. FIG. 23 illustrates a structure in which the memory semiconductor dies MSD1~MSD4 except for the interface semiconductor die ISD are stacked vertically, and the interface semiconductor die ISD is electrically connected to the memory semiconductor dies MSD1~MSD4 through the interposer ITP or a base substrate.

Referring to FIG. 24, a memory chip 1003 may include a base substrate BSUB and a stacked memory device on the base substrate BSUB. The stacked memory device may include an interface semiconductor die ISD and a plurality of memory semiconductor dies MSD1~MSD4. FIG. 24 illustrates a structure in which the interface semiconductor die ISD is stacked vertically with the memory semiconductor dies MSD1~MSD4.

Referring to FIGS. 23 and 24, the interface semiconductor die ISD may include an interface command decoder ICDEC, and the memory semiconductor dies MSD1~MSD4 include memory command decoders MCDEC1~MCDEC4, respectively. The interface command decoder ICDEC may generate the interface clock enable signal ICKE for controlling clock supply of the interface semiconductor die ISD. Memory command decoders MCDEC1~MCDEC4 may generate memory clock enable signals MCKE1~MCKE4 for controlling clock supply of the memory semiconductor dies MSD1~MSD4, respectively.

FIGS. 23 and 24 illustrate example embodiments for a case that one memory semiconductor die corresponds to one channel, but example embodiments are not limited thereto. As described above, one memory semiconductor die may correspond to two or more channels and the number of the memory command decoders may be determined variously depending on the number of the channels in each memory semiconductor die.

The base substrate BSUB may be the same as the interposer ITP or may include the interposer ITP. The base substrate BSUB may be a printed circuit board (PCB). External connecting elements such as conductive bumps BMP may be formed on a lower surface of the base substrate BSUB, and internal connecting elements such as conductive bumps uBMP may be formed on an upper surface of the base substrate B SUB. In the example embodiment of FIG. 25, the interface semiconductor die ISD and the memory semiconductor dies MSD1~MSD4 may be electrically connected through the through-silicon vias. The stacked semiconductor dies BSD and MSD1~MSD4 may be packaged using resin RSN.

Figure 25:
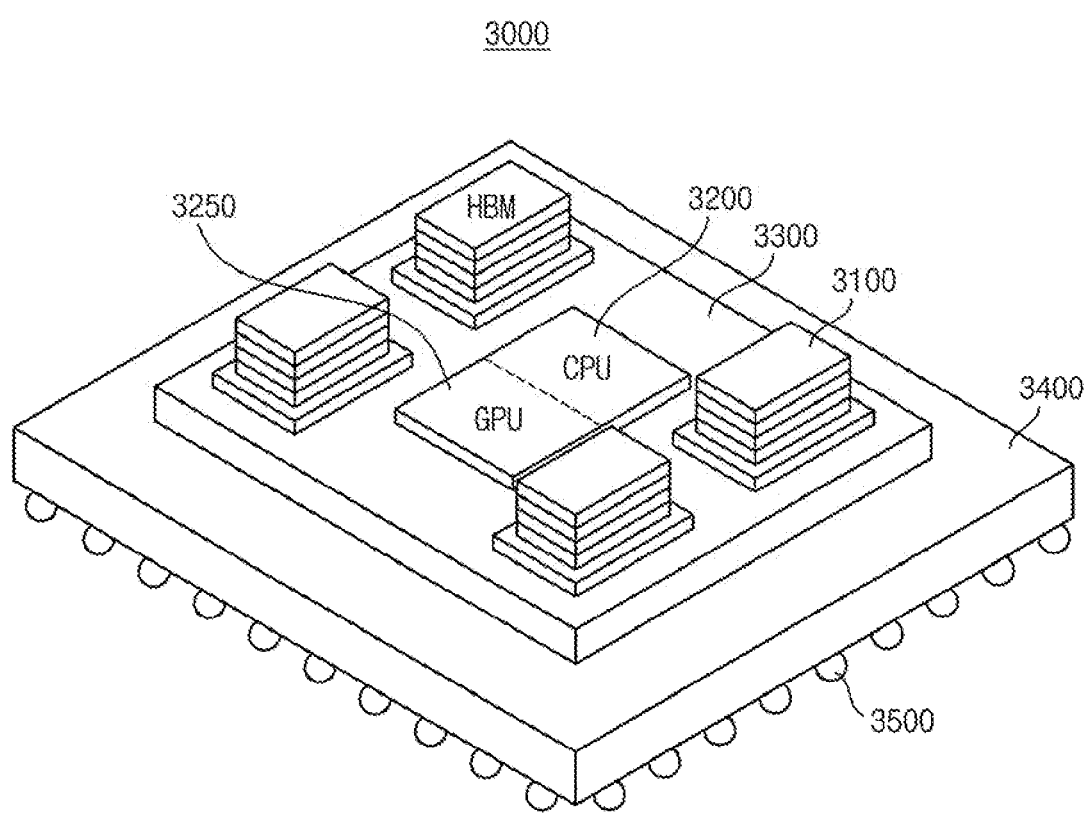
FIG. 25 is a perspective view of a semiconductor package including a stacked memory device according to example embodiments.

FIG. 25 is a perspective view of a semiconductor package including a stacked memory device according to example embodiments.

Referring to FIG. 25, a semiconductor package 3000 may include one or more stacked memory devices 3100, a central processing unit (CPU) 3200, and a graphic processing unit (GPU) 3250.

The stacked memory devices 3100, the CPU 3200, and the GPU 3250 may be mounted on an interposer 3300. The interposer 3300, on which the stacked memory device 3100, the CPU 3200, and the GPU 3250 are mounted, may be mounted on a package substrate 3400. The CPU 3200 or the GPU 3250 may be implemented to perform the function of the above-described host device. The CPU 3200 and the GPU 3250 may correspond to the processor cores 2120 and 2130 in FIG. 7, respectively.

The stacked memory device 3100 may be implemented in various forms, and the stacked memory device 3100 may be a memory device in a high bandwidth memory (HBM) form in which a plurality of layers are stacked. Accordingly, the stacked memory device 3100 may include an interface semiconductor die and a plurality of memory semiconductor dies. The stacked memory device 3100 may include a configuration to control clock supply as described above.

Each of the stacked memory devices 3100, the CPU 3200, and the GPU 3250 may include a physical layer (PHY), and communication may be performed between the stacked memory devices 3100, the CPU 3200, and the GPU 3250 through the physical layers. When the stacked memory device 3100 includes a direct access region, a test signal may be provided into the stacked memory device 3100 through conductive means (e.g., solder balls 3500) mounted under package substrate 3400 and the direct access region.

Figure 26:
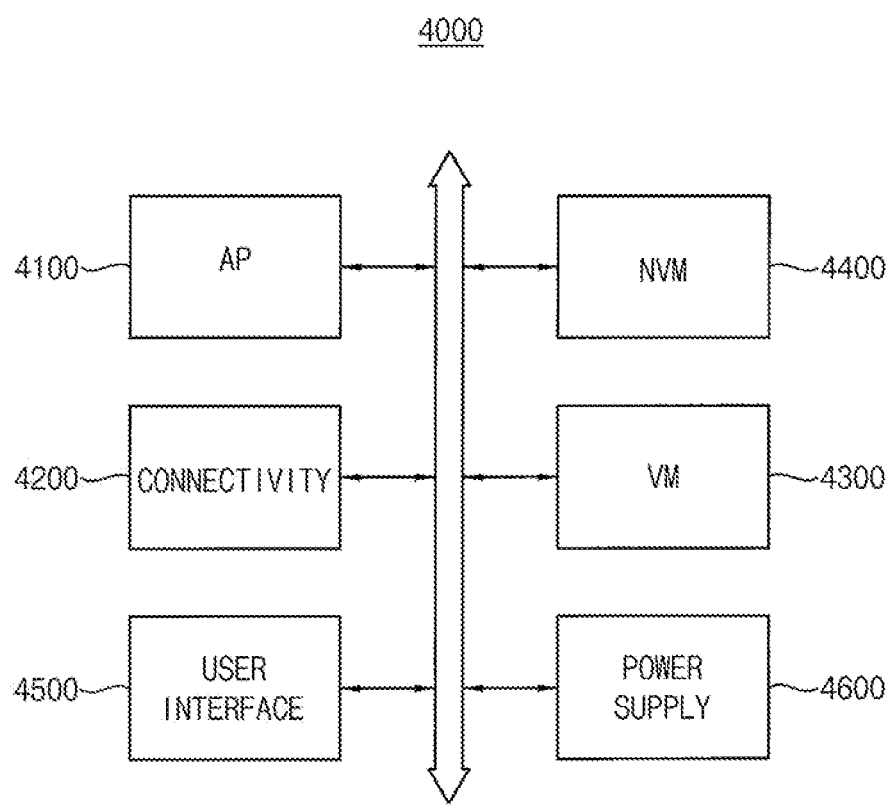
FIG. 26 is a block diagram illustrating a system including a semiconductor memory device according to example embodiments.

FIG. 26 is a block diagram illustrating a system including a semiconductor memory device according to example embodiments.

Referring to FIG. 26, a system 4000 may include an application processor 4100, a connectivity unit 4200, a volatile memory device (VM) 4300, a nonvolatile memory device 4400, a user interface 4500, and a power supply 4600. The system 4000 may be a mobile system such as a mobile phone, a smartphone, a personal digital assistance (PDA), a portable multimedia player PMP, a digital camera, a music player, a portable game console, a navigation system, etc.

The application processor 4100 may execute applications such as a web browser, a game application, a video player, etc. The application processor 4100 may include a single processor core or a plurality of processor cores. The application processor 4100 may further include a cache memory.

The connectivity unit 4200 may perform wired or wireless communication with an external device. For example, the connectivity unit 4200 may be implemented to perform an ethernet communication, a near field communication (NFC), a radio frequency identification (RFID) communication, a mobile telecommunication, a memory card communication, a universal serial bus (USB) communication, etc. For example, the connectivity unit 4200 may include a baseband chipset, and support GSM, GPRS, WCDMA, or HSxPA communications, etc.

The volatile memory device 4300 may store data processed by the application processor 4100, or may operate as a working memory. For example, the volatile memory device 4300 may be a dynamic random access memory (DRAM) such as DDR SDRAM, LPDDR SDRAM, GDDR SDRAM, RDRAM, etc.

The nonvolatile memory device 4400 may store a boot image for booting the system 4000. For example, the nonvolatile memory device 4400 may be an EEPROM (Electrically Erasable Programmable Read-Only Memory), a Flash Memory, a PRAM (Phase Change Random Access Memory), a RRAM (Resistance Random Access Memory), a NFGM (Nano Floating Gate Memory), a PoRAM (Polymer Random Access Memory), a MRAM (Magnetic Random Access Memory), a FRAM (Ferroelectric Random Access Memory), etc.

The user interface 4500 may include at least one input device, such as a keypad, a touch screen, etc., and at least one output device, such as a speaker, a display device, etc. The power supply 4600 may supply a power supply voltage to the system 4000. In some example embodiments, the system 4000 may further include a camera image processor (CIS), and/or a storage device, such as a memory card, a solid state drive (SSD), a hard disk drive (HDD), a CD-ROM, etc.

The components of the system 4000 may be integrated using various packages such as a PoP (Package on Package), BGAs (Ball grid arrays), CSPs (Chip scale packages), a PLCC (Plastic Leaded Chip Carrier), a PDIP (Plastic Dual In-Line Package), a Die in Waffle Pack, a Die in Wafer Form, a COB (Chip On Board), a CERDIP (Ceramic Dual In-Line Package), a MQFP (Plastic Metric Quad Flat Pack), a TQFP (Thin Quad Flat-Pack), a SOIC (Small Outline Integrated Circuit), a SSOP (Shrink Small Outline Package), a TSOP (Thin Small Outline Package), a TQFP (Thin Quad Flat-Pack), a SIP (System In Package), a MCP (Multi Chip Package), a WFP (Wafer-level Fabricated Package), a WSP (Wafer-Level Processed Stack Package), etc.

At least one of the volatile memory device 4300 and the nonvolatile memory device 4400 may include a configuration to control clock supply that removes a dedicated clock enable signal while providing a clock enable signal based on command signals.

Example embodiments may be applied to various electronic devices and systems. For example, example embodiments may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

By way of summation and review, as a number of stacked semiconductor dies is increased, a number of input-output pins of the semiconductor memory device may increase. The increased number of the input-output pins may degrade design margin and restrict reduction of the size of the semiconductor memory device.

As described above, embodiments may provide a semiconductor memory device and a system including a semiconductor memory device that are capable of efficiently controlling a clock supply. A semiconductor memory device and a system according to example embodiments may enhance design margin and reduce size by removing a clock enable pin, and controlling the clock supply based on the command signals. In addition, a semiconductor memory device and a system according to example embodiments may efficiently implement signal synchronization by transferring undecoded command signals from an interface semiconductor die to a memory semiconductor die, and decoding the transferred command signals in the memory semiconductor die.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
an interface semiconductor die including a plurality of command pins configured to receive a plurality of command signals, which are transferred from a memory controller, and including an interface command decoder configured to decode the plurality of command signals;
a memory semiconductor die stacked with the interface semiconductor die, the memory semiconductor die including a memory integrated circuit configured to store data, and including a memory command decoder configured to decode the plurality of command signals, which are transferred from the interface semiconductor die; and
a plurality of through-silicon vias electrically connecting the interface semiconductor die and the memory semiconductor die, wherein:
the interface semiconductor die does not include a clock enable pin to receive a clock enable signal from the memory controller,
the interface command decoder is configured to generate an interface clock enable signal to control a first clock supply with respect to the interface semiconductor die based on a power mode command, which is transferred through the plurality of command pins from the memory controller, and
the memory command decoder is configured to generate a memory clock enable signal to control a second clock supply with respect to the memory semiconductor die based on the power mode command, which is transferred through the plurality of through-silicon vias from the interface semiconductor die.

2. The semiconductor memory device as claimed in claim 1, wherein:
the interface command decoder is configured to generate the interface clock enable signal based on selected command signals corresponding to a portion of the plurality of command signals, and
the memory command decoder is configured to generate the memory clock enable signal based on the selected command signals.

3. The semiconductor memory device as claimed in claim 1, wherein:
the interface command decoder is configured to deactivate the interface clock enable signal based on selected command signals corresponding a portion of the plurality of command signals, and to activate the interface clock enable signal based on one command signal among the selected command signals, and
the memory command decoder is configured to deactivate the memory clock enable signal based on the selected command signals, and to activate the memory clock enable signal based on the one command signal.

4. The semiconductor memory device as claimed in claim 1, wherein:
the interface semiconductor die further includes an interface clock gating circuit configured to receive an external clock signal, which is transferred from the memory controller, and to gate the external clock signal based on the interface clock enable signal to provide an interface clock signal for operations of the interface semiconductor die, and
the memory semiconductor die further includes a memory clock gating circuit configured to receive the external clock signal, which is transferred from the interface semiconductor die, and to gate the external clock signal based on the memory clock enable signal to provide a memory clock signal for operations of the memory semiconductor die.

5. The semiconductor memory device as claimed in claim 1, wherein:
the power mode command includes a power-down entry command and a power-down exit command,
the interface command decoder is configured to deactivate the interface clock enable signal in response to the power-down entry command, and to activate the interface clock enable signal in response to the power-down exit command, and
the memory command decoder is configured to deactivate the memory clock enable signal in response to the power-down entry command, and to activate the memory clock enable signal in response to the power-down exit command.

6. The semiconductor memory device as claimed in claim 1, wherein:
the power mode command includes a self-refresh entry command and a self-refresh exit command,
the interface command decoder is configured to deactivate the interface clock enable signal in response to the self-refresh entry command, and to activate the interface clock enable signal in response to the self-refresh exit command, and
the memory command decoder is configured to deactivate the memory clock enable signal in response to the self-refresh entry command, and to activate the memory clock enable signal in response to the self-refresh exit command.

7. The semiconductor memory device as claimed in claim 1, wherein:
the interface semiconductor die includes a set-reset latch circuit configured to deactivate the interface clock enable signal in response to a set signal indicating a timing of a power mode entry command, and to activate the interface clock enable signal in response to a reset signal indicating a timing of a power mode exit command, and
the memory semiconductor die includes a set-reset latch circuit having a same configuration as the set-reset latch circuit of the interface semiconductor die and configured to deactivate the memory clock enable signal in response to the set signal, and to activate the memory clock enable signal in response to the reset signal.

8. The semiconductor memory device as claimed in claim 7, wherein:
the set-reset latch circuit includes a first NAND gate and a second NAND gate,
the first NAND gate performs a NAND logic operation on the set signal and an output of the second NAND gate, to generate the interface clock enable signal or the memory clock enable signal, and
the second NAND gate performs a NAND logic operation on the reset signal and an output of the first NAND gate.

9. The semiconductor memory device as claimed in claim 7, wherein:
each of the interface command decoder and the memory command decoder includes a decoding logic that includes:
a first logic gate configured to perform a first logic operation on selected command signals corresponding a portion of the plurality of command signals;
a second logic gate configured to perform a second logic operation on the selected command signals;
a first flip-flop configured to latch an output of the first logic gate in response to an external clock signal, which is transferred from the memory controller, to generate the set signal; and
a second flip-flop configured to latch an output of the second logic gate in response to the external clock signal, to generate the reset signal.

10. The semiconductor memory device as claimed in claim 9, wherein the interface semiconductor die is configured to deactivate, among the plurality of command pins, other command pins except selected command pins corresponding to the selected command signals in response to deactivation of the interface clock enable signal, and to activate the other command pins in response to activation of the interface clock enable signal.

11. The semiconductor memory device as claimed in claim 7, wherein:
each of the interface command decoder and the memory command decoder includes a decoding logic that includes:
a logic gate configured to perform a logic operation on selected command signals corresponding a portion of the plurality of command signals; and
a flip-flop configured to latch an output of the logic gate in response to an external clock signal, which is transferred from the memory controller, to generate the set signal, and
the decoding logic provides one command signal among the selected command signals as the reset signal.

12. The semiconductor memory device as claimed in claim 11, wherein the interface semiconductor die is configured to deactivate, among the plurality of command pins, other command pins except one command pin corresponding to the one command signal in response to deactivation of the interface clock enable signal, and to activate the other command pins in response to activation of the interface clock enable signal.

13. The semiconductor memory device as claimed in claim 1, wherein the memory integrated circuit included in each memory semiconductor die forms a plurality of channels that are accessed by the memory controller independently of each other.

14. The semiconductor memory device as claimed in claim 13, wherein each memory command decoder is assigned to each channel.

15. The semiconductor memory device as claimed in claim 1, wherein the semiconductor memory device is a high bandwidth memory device.

16. The semiconductor memory device as claimed in claim 15, wherein:
the interface semiconductor die is configured to activate one command pin among the plurality of command pins and deactivate other command pins except the one command pin when the semiconductor memory device enters a first power mode in which at least the first clock supply is blocked, and
the interface semiconductor die is configured to activate the other command pins when the semiconductor memory device exits from the first power mode.

17. A system, comprising:
a semiconductor memory device; and
a host device including a memory controller configured to control the semiconductor memory device, wherein:
the semiconductor memory device includes:
an interface semiconductor die including a plurality of command pins configured to receive a plurality of command signals, which are transferred from the memory controller, and including an interface command decoder configured to decode the plurality of command signals;
a memory semiconductor die stacked with the interface semiconductor die, the memory semiconductor device including a memory integrated circuit configured to store data, and including a memory command decoder configured to decode the plurality of command signals, which are transferred from the interface semiconductor die; and
a plurality of through-silicon vias electrically connecting the interface semiconductor die and the memory semiconductor die,
the interface semiconductor die does not include a clock enable pin to receive a clock enable signal from the memory controller,
the interface command decoder is configured to generate an interface clock enable signal to control a first clock supply with respect to the interface semiconductor die based on a power mode command, which is transferred through the plurality of command pins from the memory controller, and
the memory command decoder is configured to generate a memory clock enable signal to control a second clock supply with respect to the memory semiconductor die based on the power mode command, which is transferred through the plurality of through-silicon vias from the interface semiconductor die.

18. The system as claimed in claim 17, wherein:
the memory controller does not transfer the clock enable signal to the semiconductor memory device, and
the interface command decoder and the memory command decoder are configured to control clock supplies with respect to the interface semiconductor die and the memory semiconductor die, respectively, based on the plurality of command signals.

19. A semiconductor memory device, comprising:
an interface semiconductor die including a plurality of command pins configured to receive a plurality of command signals, which are transferred from a memory controller, and including an interface command decoder configured to decode the plurality of command signals;
a memory semiconductor die including a memory integrated circuit configured to store data, and including a memory command decoder configured to decode the plurality of command signals, which are transferred from the interface semiconductor die; and
a plurality of internal command paths electrically connecting the interface semiconductor die and the memory semiconductor die, wherein:
the interface semiconductor die does not include a clock enable pin to receive a clock enable signal from the memory controller,
the interface command decoder is configured to generate an interface clock enable signal to control a first clock supply with respect to the interface semiconductor die based on a power mode command, which is transferred through the plurality of command pins from the memory controller, and the memory command decoder is configured to generate a memory clock enable signal to control a second clock supply with respect to the memory semiconductor die based on the power mode command, which is transferred through the plurality of internal command paths from the interface semiconductor die.

20. The semiconductor memory device as claimed in claim 19, wherein:

the semiconductor memory device is a stacked memory device in which the memory semiconductor die is stacked with the interface semiconductor die, and each of the plurality of internal command paths includes a through-silicon via.

* * * * *